United States Patent [19]
Sogard et al.

[11] Patent Number: 6,014,200
[45] Date of Patent: Jan. 11, 2000

[54] HIGH THROUGHPUT ELECTRON BEAM LITHOGRAPHY SYSTEM

[75] Inventors: Michael R. Sogard, Menlo Park; John McCoy, San Carlos, both of Calif.

[73] Assignee: Nikon Corporation, Japan

[21] Appl. No.: 09/028,721

[22] Filed: Feb. 24, 1998

[51] Int. Cl.[7] ............................ G03B 27/42; G03B 27/54; A61N 5/00
[52] U.S. Cl. ............................ 355/53; 355/67; 250/492.3
[58] Field of Search .................................. 355/18, 53, 67; 250/492.1, 492.2, 492.3, 492.22, 548; 430/30, 296, 329

[56] References Cited

U.S. PATENT DOCUMENTS

| | | | |
|---|---|---|---|
| 4,354,111 | 10/1982 | Williams et al. | 250/492.2 |
| 4,724,328 | 2/1988 | Lischke | 250/492.2 |
| 4,899,060 | 2/1990 | Lischke | 250/505.1 |
| 4,982,099 | 1/1991 | Lischke | 250/492.2 |
| 4,996,441 | 2/1991 | Lischke | 250/492.2 |
| 5,260,579 | 11/1993 | Yasuda et al. | 250/492.2 |
| 5,334,282 | 8/1994 | Nakayama et al. | 250/492.2 |
| 5,466,904 | 11/1995 | Pfeiffer et al. | 219/121.25 |

FOREIGN PATENT DOCUMENTS

| | | | |
|---|---|---|---|
| 60-31226 | 2/1985 | Japan | H01L 21/30 |
| 3-174715 | 7/1991 | Japan | H01L 21/027 |
| 5-166707 | 7/1993 | Japan | H01L 21/027 |
| 7-254540 | 10/1995 | Japan | H01L 21/027 |
| 7-263299 | 10/1995 | Japan | H01L 21/027 |

*Primary Examiner*—Safet Metjahic
*Assistant Examiner*—Peter B. Kim
*Attorney, Agent, or Firm*—Skjerven, Morrill, MacPherson, Franklin & Friel LLP; Norman R. Klivans

[57] ABSTRACT

An electron beam lithography system having a beamlet shaping section that includes a first multi-aperture array having m rows and n columns of apertures having a first shape and a second multi-aperture array with m rows and n columns of apertures having a second shape. Electron beamlets formed by the first multi-aperture array are deflected by a deflector unit before passing through the second multi-aperture array. The superposition of the electron beamlets on the second multi-aperture produces electron beamlets having a selected shape. Deflection logic on an active beam aperture array blank selected electron beamlets. The deflection logic can be updated with the next logic pattern as the current logic pattern is being executed. The unblanked electron beamlets are directed onto a surface to be exposed. The deflection logic on the active beam aperture array, and the multi-aperture arrays, are shielded from electrons and x-rays generated by the electrons striking surfaces within the electron beam lithography system. Sensitive deflection logic is radiation hardened to prevent degradation.

38 Claims, 14 Drawing Sheets

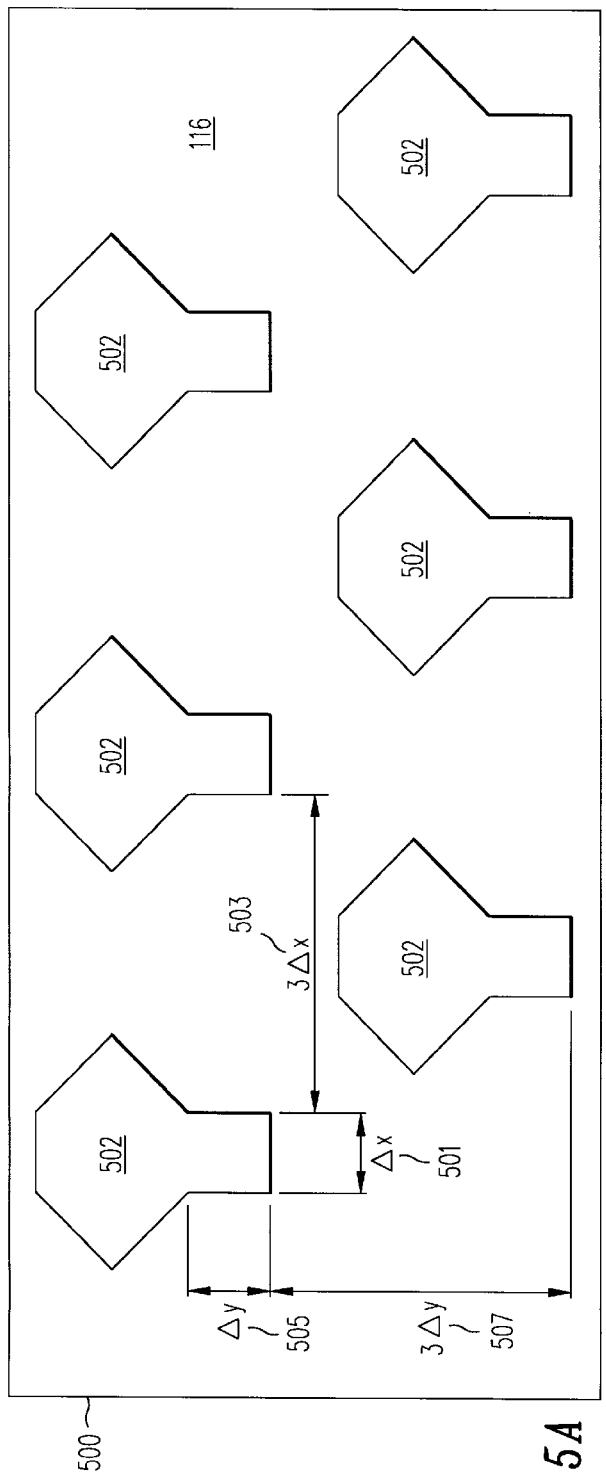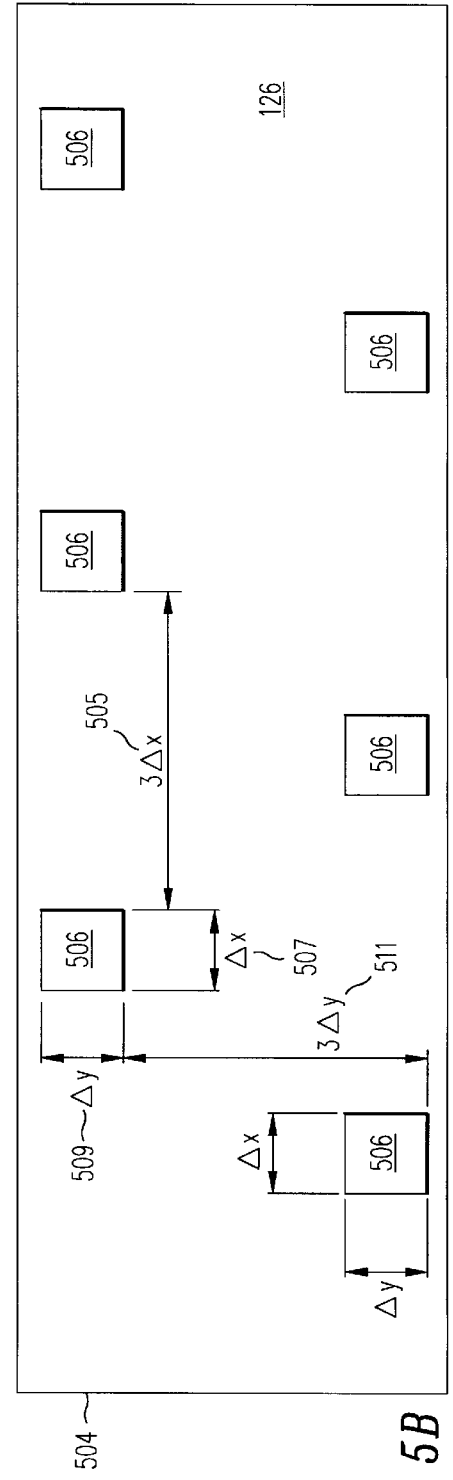
FIG. 5A
FIG. 5B

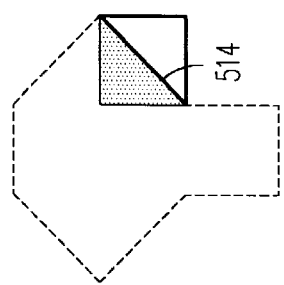
FIG. 5F
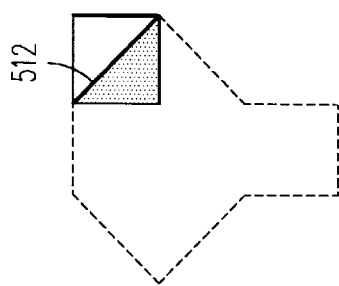
FIG. 5E
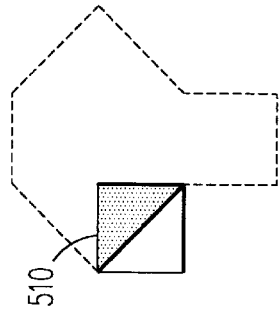
FIG. 5D
FIG. 5C
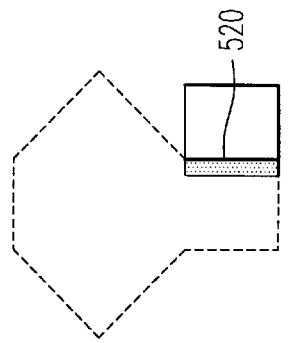
FIG. 5I
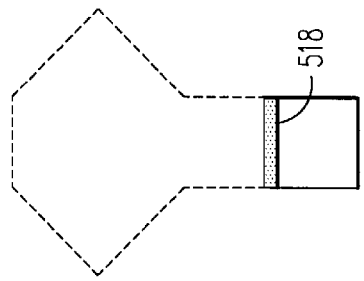
FIG. 5H
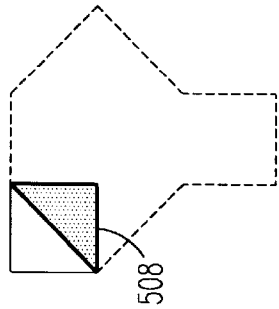
FIG. 5G

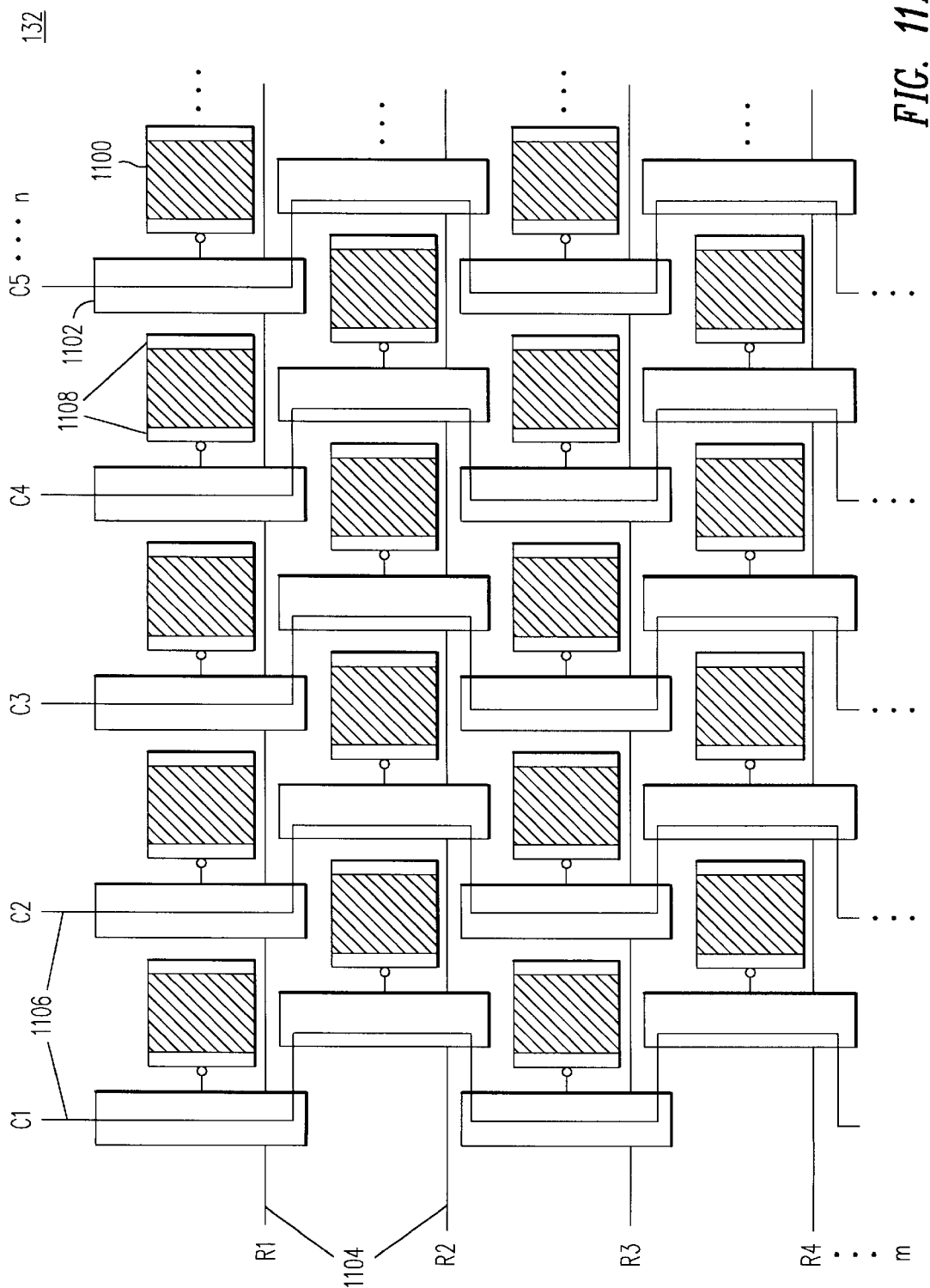

HIGH THROUGHPUT ELECTRON BEAM LITHOGRAPHY SYSTEM

1. FIELD OF THE INVENTION

This invention relates generally to a high throughput electron beam lithography system for producing a pattern on a surface such as a semiconductor wafer and a method of exposing such a pattern on the surface. More particularly, this invention relates to an electron beam lithography method and system having improved throughput.

2. BACKGROUND OF THE INVENTION

Because there is a continuing requirement to increase the integration density of integrated circuits, new techniques for creating a pattern on a surface such as a semiconductor wafer have been developed. One such technique is the electron beam lithography system and method in which electrons are directed onto the semiconductor surface to expose an electron sensitive resist coating on the surface. After exposure and development, the resist pattern is used as a template to effect patterned modifications on or to the underlying semiconductor substrate.

The classic electron beam lithography system is the "probe-forming" system in which a narrow beam that is the image of the electron source and having a Gaussian distribution is scanned over the surface to be exposed. The narrow beam is scanned a pixel at a time, the pixel being defined as the full width at half height of the beam intensity distribution. These systems can have the highest spatial resolution, but lowest throughput of all e-beam lithography systems due to the serial exposure of patterns one pixel at a time. The advantage of systems that serially expose patterns is that corrections can be applied dynamically pixel by pixel to compensate for aberrations of the electron lenses and deflection units in the system. Furthermore, if the pixel represents the smallest feature of the desired pattern, a pattern of any arbitrary complexity can be created with this type of probe. Proximity corrections are also easily made with this type of probe. An increase in throughput can be achieved by producing a larger spot on the wafer, adjustable in size and shape, so that it is equal to or greater than the minimum feature size of the circuit. Systems with this feature create a shaped spot on the wafer by generating an image of apertures or other objects illuminated by the source, that is, not an image of the source itself. The image is electronically variable in size and adjustable to compose a pattern feature with serial exposures projecting up to several hundred pixels in parallel. The images created are typically variable sized rectangles (including squares) or triangles.

More complicated shapes are created in cell block projection systems, see for example, H. C. Pfeiffer, IEEE Trans. Electr. Dev. ED26, 663(1979), where the image on the wafer is projected from a patterned mask at a conjugate image plane. Various patterns are available on the mask; they are selected by deflecting the illuminating beam to the appropriate pattern location on the mask. The patterns placed on the mask are those which are used repeatedly in a pattern on a chip on the semiconductor wafer so that each chip can be exposed with an economy of shots. This strategy is most efficient for circuits with a high degree of repetitiveness, such as DRAMs, and can lead to a significant increase in throughput.

Electron beam lithographic systems have been developed that utilize a particle beam source, a condenser lens system and a controllable aperture diaphragm having a line-shaped multi-hole structure for forming a plurality of particle beams, and a blanking diaphragm. Such devices are described in the following U.S. Pat. Nos. 4,724,328; 4,899,060; 4,982,099; and 4,996,441. U.S. Pat. No. 4,899,060 describes a diaphragm system forming a plurality of particle probes having a variable cross section. However, the particle probes described in the above patents are limited in number and are limited to linear arrays.

Throughput traditionally is measured by the number of wafers that can be patterned in an hour. An essential issue for all electron beam lithography systems is that throughput increases with increasing electron beam current delivered to the wafer; but the maximum current is limited by electron-electron and space charge considerations related to the basic repulsive Coulomb forces between electrons. These forces blur and distort the images on the wafer. This limit represents an important practical limit to throughput for existing electron beam lithography systems.

A charged beam lithography system having an improved throughput is described in Japanese Unexamined Patent Publication No. 60-31226, assigned to NTT (Nippon Telephone & Telegraph), having an application date of Aug. 1, 1983. This publication discloses a multi-beam device having the capability of blanking each beam independently by electrostatic deflection at the apertures that define each beam. The electrostatic deflection is controlled by electronic circuitry located adjacent to each aperture. A similar system is described in a Fujitsu Japanese Patent Publication No. 3-174715. Such architecture can allow a large number of beams. However, the circuitry is directly exposed to irradiation by electrons and x-rays, so its lifetime would be expected to be quite short. Furthermore, the beams in the NTT and Fujitsu devices are fixed sized beams that limit the capability of the device to create patterns of arbitrary size and shape. Only by using a system demagnification high enough that each beamlet is small enough to represent a pixel in the pattern would these systems be capable of creating arbitrary shapes. This would decrease the throughput of the system.

Other electron beam lithography systems are disclosed in Japanese Patent Publication Numbers: 05-166707; 07-263299; and 07-254540. These systems also create fixed shape multi-beams using independently blankable apertures. However, the aperture blanking is controlled by remote electronic circuitry. Each aperture blanker is independently connected to the remote electronics. The space required to route all of these connections limits the aperture array to be approximately one-dimensional. Thus, the total number of apertures is limited, as is throughput.

An electron beam projection system (EBPS) has been disclosed in U.S. Pat. No. 5,466,904 that uses a mask containing the entire chip pattern, however, only a small portion of the mask is illuminated with each exposure. Illuminating only a small portion of the mask relaxes the requirements for the electron optical system. The complete mask pattern is illuminated by a combination of the mechanical movement of the mask that is mounted on a movable reticle or mask stage and the deflection of the electron beam. The wafer stage is moved simultaneously with an appropriate deflection of the electron beam so that the illuminated area on the wafer chip site corresponds with the matching patterned area on the mask. Thus for each chip pattern, a new reticle must be constructed. As can be appreciated, the manufacture of the mask (reticle) for the EBPS is a challenging task and the required mechanical system is complicated, as two stages must move in exact synchronization to achieve a high degree of accuracy. In order to achieve a high throughput, high quality electron optics must be used that have a careful balance of optical aberrations to permit the use of high beam currents and also to permit high electron beam deflections.

The prior art can be summarized as follows. Relatively high throughput is possible with complicated systems employing reticles, which are expensive and difficult to build; a new reticle is needed for each new chip pattern to be produced. Greater flexibility and simplicity is obtained with systems which use a multiplicity of beamlets, which are created at an aperture plane and controlled by beam blanking deflectors associated with each beamlet. If the deflectors are controlled from electronics at a distance from the beam, the number of beamlets is limited by electrical connection problems. If deflection circuitry is located in proximity to each beamlet blanking deflector, the circuitry is rapidly destroyed by irradiation from electrons and x-rays. These beamlets are fixed in size, limiting their application. Further improvement in throughput in multi-beam systems would result from the inclusion of variable shape beamlets.

Accordingly, there is a need for a high-throughput electron beam lithography system that is capable of providing variable size and shape electron beamlets that can be individually blanked. In addition, there is a need for critical elements in the system to be shielded from the effects of radiation generated by the electrons or other charged particles striking surfaces within the lithography system.

SUMMARY OF THE INVENTION

The present invention overcomes the above problems of prior art electron beam systems and provides other additional advantages through a method and apparatus for exposing a surface such as a semiconductor wafer with a charged beam. One embodiment includes a source of electrons, a beamlet shaping section that includes a first multi-aperture array with m rows and n columns of apertures having a first shape and a second multi-aperture array with m rows and n columns of apertures having a second shape and with the surface to be exposed mounted on a movable stage.

In accordance with an aspect of the invention a beamlet blanking section is disposed between the beamlet shaping section and the surface to be exposed.

The electrons that pass through the first multi-aperture array are formed into electron beamlets having the shape of the apertures in the first multi-aperture array and are directed towards the centers of corresponding apertures in the second multi-aperture array. An electron deflector between the two multi-aperture arrays deflects each electron beamlet away from the centers of the apertures in the second multi-aperture array, forming electron beamlets having a selected shape determined by the superposition of the deflected electron beamlets having the first shape onto the second shape of the apertures in the second multi-aperture array.

The beamlet blanking section includes an active beam aperture array having m rows and n columns of apertures and is located between the second multi-aperture array and the surface to be exposed. The electron beamlets passing through the second multi-aperture array are directed towards the corresponding apertures in the active beam aperture array. Logic circuits located adjacent to each of the apertures in the active beam aperture array control electrostatic deflectors that deflect, or blank, selected electron beamlets to prevent the selected electron beamlets from striking the surface to be exposed. The logic circuits are updated with the next pattern logic as the current pattern logic is being used. The undeflected beamlets passing through the active beam aperture array are focused onto the surface to be exposed.

Because the apertures in the active beam aperture array are separated by spaces, the corresponding beamlets on the surface to be exposed are also separated by spaces. These spaces are filled in to make the complete pattern, by deflecting the beamlets with a set of deflectors located between the active beam aperture array and the surface to be exposed, while changing the pattern of unblanked beamlets and their cross sectional shapes appropriately. When the pattern on the surface to be exposed is completed within the area determined by the active beam aperture array, the beamlets are deflected to an adjacent area on the surface to be exposed, and the above process is repeated. This process continues until deflectors in a fourth electron lens group have swept through their allowable range. A new region of surface to be exposed is then provided by suitable motion of a movable stage supporting the surface to be exposed.

In another aspect of the invention, a shield having m rows and n columns of apertures is located above the active beam aperture array to protect the active beam aperture array from being struck by scattered electrons or by x-rays generated by electrons striking surfaces within the system. A contrast aperture absorbs the electron beamlets that have been blanked by the active beam aperture array.

In accordance with another aspect of the invention, a second shield having m rows and n columns of apertures is located beneath the active beam aperture array to protect the active beam aperture array from being struck by backscattered electrons and by x-rays generated downstream from the active beam aperture array.

In accordance with another aspect of this invention a baffle is located between the second multi-aperture array and the active beam aperture array, to protect the latter from being struck by x-rays generated in the multi-aperture arrays.

The described electron-beam lithography system provides an improved throughput because the active beam aperture array can be large and can be on the order of 1000 by 1000 apertures, because the next pattern can be input to the logic as soon as the current pattern is completed, and because variable shaped beams are possible.

The separate beamlet shaping section allows the beamlets to be shaped prior to the beamlets entering the beamlet blanking section. The maximum size of each beamlet is smaller than the size of its corresponding aperture in the active beam aperture array. Thus, no primary electrons strike this array. This protects the logic associated with each aperture in the active beam aperture array from being damaged by electrons. In addition, the logic can be radiation hardened and the utilization of shields above and/or below the active beam aperture array also prevents the logic from being damaged, either by scattered electrons or by x-rays. The protection of the sensitive logic circuits provides for a longer lifetime than can be achieved in prior art systems.

These and other advantages of the present invention will become more apparent upon a reading of the detailed description of the preferred embodiments that follows, when considered in conjunction with the drawings of which the following is a brief description. It should be clear that the drawings are merely illustrative of the currently preferred embodiments of the present invention, and that the invention is in no way limited to the illustrated embodiments. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIG. 5A is a plan view of a portion of a first multi-aperture array;

FIG. 5B is a plan view of a portion of a second multi-aperture array;

FIGS. 5C–5I shows some of the resultant cross-sectional shapes of electron beamlets that are obtainable when the electron beamlets emerging from apertures in the first multi-aperture array are superimposed on apertures in the second multi-aperture array;

FIG. 11A illustrates the association of the blanker logic circuits with each aperture in the active beam aperture array;

DETAILED DESCRIPTION

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements.

Referring now to the Figures, the several embodiments of the present invention will now be described.

Figure 1:
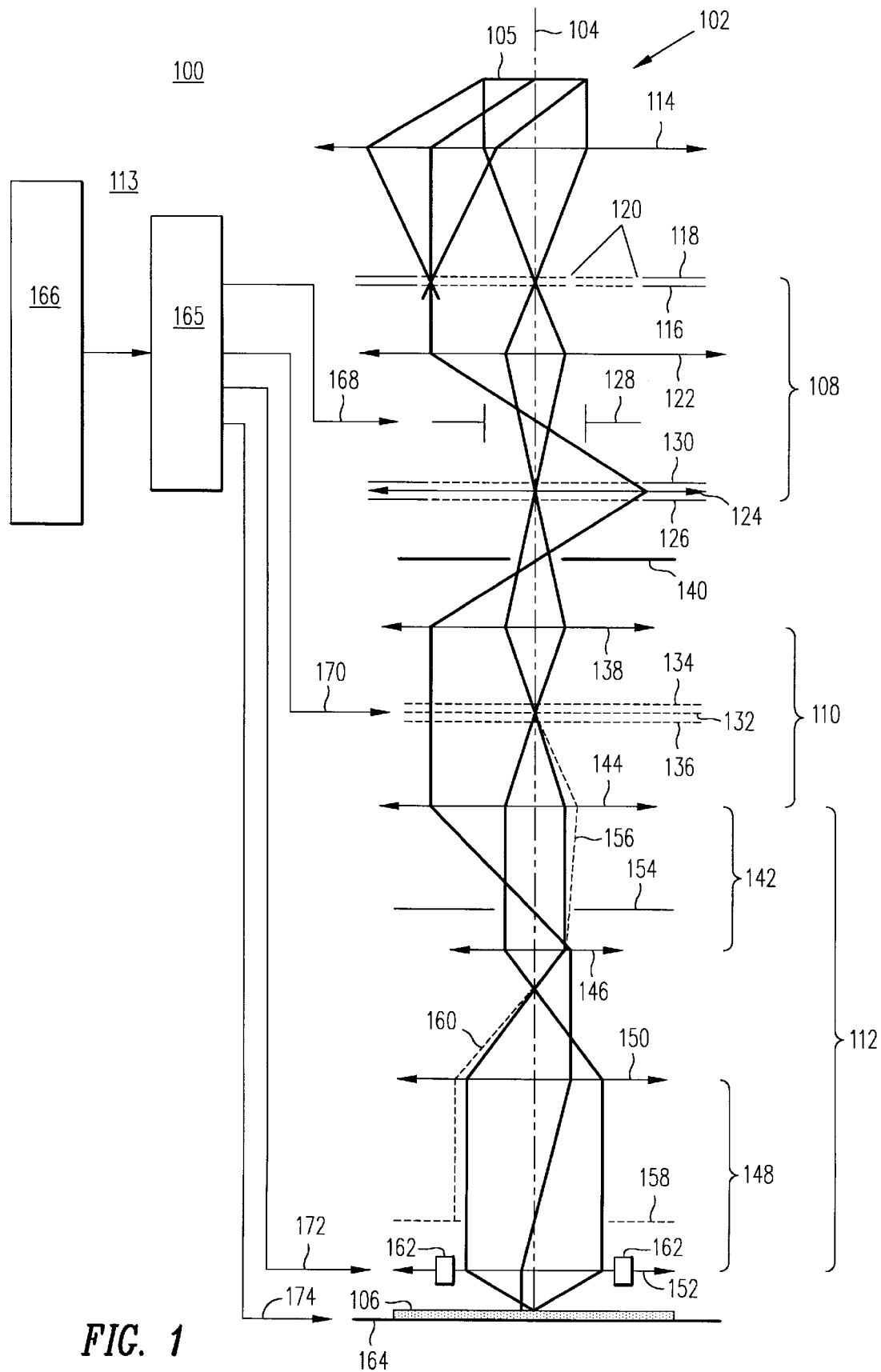
FIG. 1 is a partially pictorial, partially schematic diagram of an electron beam lithography system in accordance with the present invention.

FIG. 1 is a partially pictorial and partially schematic diagram of an electron beam lithography system 100 constructed in accordance with an embodiment of the present invention. For purposes of explanation, the electron beam lithography system 100 is divided into sections. At the top of FIG. 1, the first section includes a source of electrons 102 and an electron lens element 114 that directs the electrons downwardly in a generally collimated beam parallel to the system axis 104 towards a surface to be exposed 106. The collimated beam of electrons enters a beam shaping section 108 where the collimated beam of electrons is shaped into electron beamlets having a selected shape. After being shaped by the beam shaping section 108, the electron beamlets are directed into a beam blanking section 110 where selected electron beamlets are blanked so that they do not strike the surface to be exposed 106. After the electron beamlets leave the beam blanking section 110, the electron beamlets are demagnified and directed onto the surface to be exposed 106 by an electron lens group 112. A control section 113 controls the overall operation of the electron beam lithography system 100.

The source of electrons 102 can be an electron gun that emits electrons downwardly, generally parallel to the system axis 104. The basic electron source parameter dictated by the present application is the emittance $\epsilon = \pi^2 (\text{beam radius})^2 (\text{beam angle})^2$. In the absence of apertures that remove portions of the electron beam, or changes in voltage, the emittance $\epsilon$ is invariant and can be defined at any point in the column. In the present embodiment, the beam size at the surface to be exposed is 0.25 mm square, and the numerical aperture is assumed to be 0.008 radian. Taking the beam radius to be that which contains the 0.25 mm square, r=0.18 mm, the emittance $\epsilon$ is approximately=20.5 (mm-milliradian)$^2$. The electron source must provide this emittance. However, because this value of emittance is much larger than conventional electron sources, a non-standard electron source must be used.

Conventional electron sources provide emittances that are smaller than that required by approximately three orders of magnitude or more. The large emittances require an electron source such as a planar cathode and a focusing system that can provide a beam angle at the active beam aperture array (ABAA) of approximately 8×10$^{-5}$ radian. The plane 105 represents the origin of the electrons. The beam of electrons is substantially collimated (parallel) by a conventional electron lens element 114 acting as a condenser. Suitable electron lens elements are well known in the art.

The beam shaping section 108 includes a first multi-aperture array 116 and optionally, a shield 118 that protects the first multi-aperture array 116 from being struck by electrons. The first multi-aperture array 116 has m rows and n columns of apertures and each aperture has a first shape. The shield 118 also has m rows and n columns of apertures and each aperture has approximately the same shape as the apertures in the first multi-aperture array 116. However, the dimensions of the apertures in the shield 118 are larger than the dimensions of the apertures in the first multi-aperture array 116 because the apertures in the multi-aperture array 116 define the shape of the electron beamlets. If a shield is utilized, the shield will absorb the majority of the electrons in the incident beam of electrons. The absorption of electrons by the shield causes the shield to heat, which in turn may cause the shield to warp. Because the apertures 120 in the shield 118 are larger than the apertures in the multi-aperture array 116, any warpage in the shield 118 should not affect the shape of the aperture. The shield 118 may be constructed to absorb all of the incident electrons that are not passed through apertures 120 in the shield 118, or the shield 118 may be constructed to absorb only a portion of the incident electrons which decreases the required elevated temperature capability of the shield 118. In the latter case, the electrons that are not absorbed by the shield 118 will pass through the shield 118 and be absorbed by the underlying first multi-aperture array 116. It should be appreciated that the electrons that pass through the shield material will have a substantially smaller energy. This requires that the first multi-aperture array 116 have the capability of withstanding an elevated temperature caused by the incident electrons that are not fully absorbed by the shield 118 as well as the incident electrons that pass through the shield apertures 120 and strike the first multi-aperture array 116.

An electron lens group, represented by electron lens elements 122 and 124, directs each of the electron beamlets towards the center of a corresponding aperture in the second multi-aperture array 126. The two multi-aperture arrays also lie in planes that are optically conjugate to one another. The second multi-aperture array 126 also has m rows and n columns of apertures that correspond to the m rows and n columns of the first multi-aperture array 116. The terms "that correspond" or "that corresponds" indicates that for every aperture in the first multi-aperture array, there is a corresponding aperture in the second multi-aperture array 126. However, the apertures in the second multi-aperture array 126 have a different shape. As discussed above, the electron lens group, represented by electron lens elements 122 and 124, directs each electron beamlet towards the center of the corresponding aperture in the second multi-aperture array 126. An electron deflector 128 deflects each electron beamlet a selected distance in a selected direction from the center of the corresponding aperture in the second multi-aperture array 126. As can be appreciated, all of the electron beamlets as they emerge from the second multi-aperture array will have the same selected cross-sectional shape.

Figure 2:
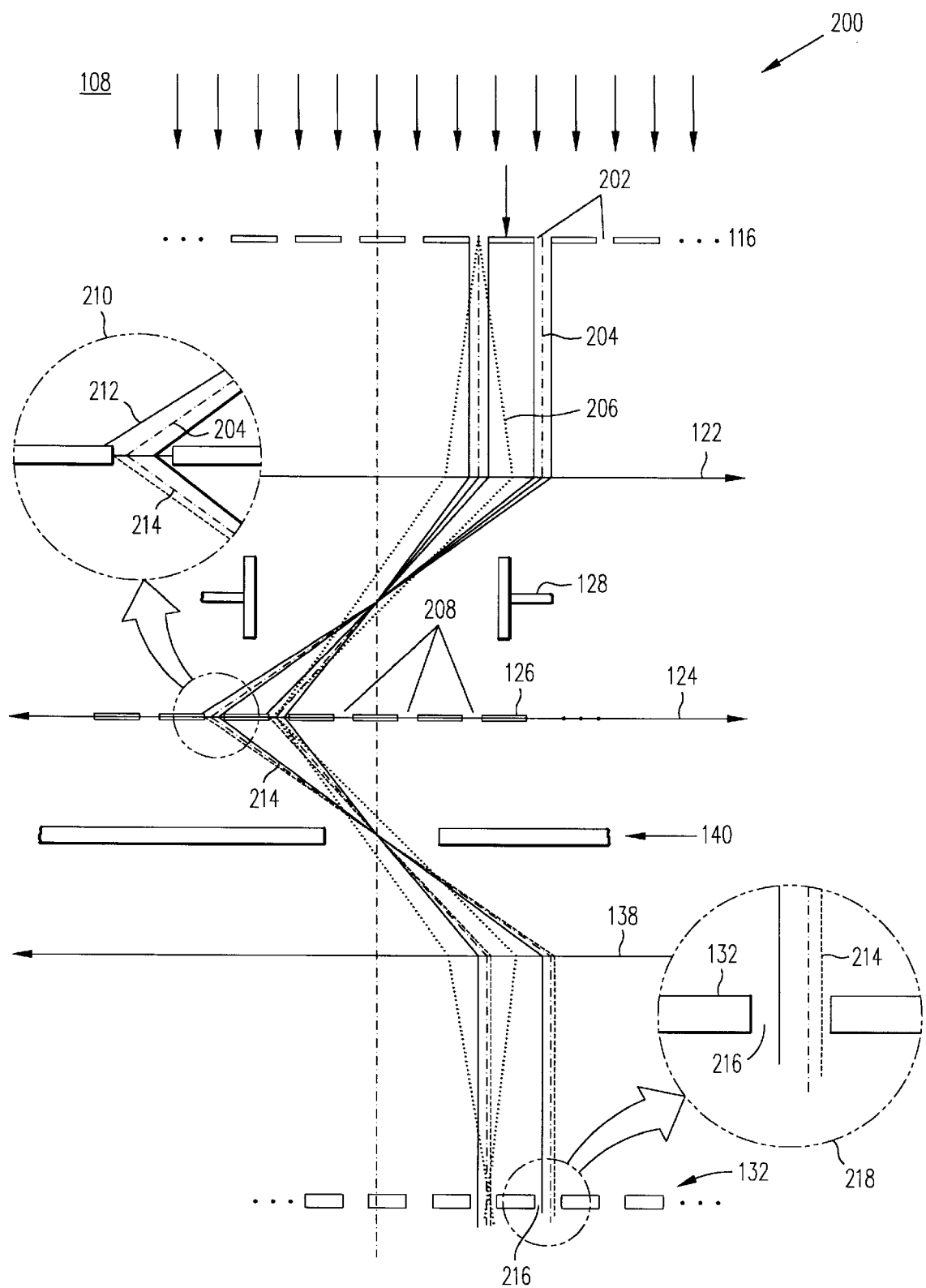
FIG. 2 shows details of the electron beamlet shaping section of the electron beam lithography system shown in FIG. 1.

Referring to FIG. 2, the formation of the electron beamlets in the beam shaping section 108 is illustrated. The collimated electron beam 200 is incident on the first multi-aperture array 116. Those electrons passing through one of the apertures 202 of multi-aperture array 116 form an electron beamlet 204. The electron beamlet 204 possesses a finite emittance characterized by both a size and an angular distribution 206. The shape of the electron beamlet 204 will be discussed below in detail in conjunction with FIGS. 5A–5C. The electron beamlet 204 is re-imaged onto the second multi-aperture array 126 by electron lens elements 122 and 124. For each aperture 202 in the first multi-aperture array 116 there corresponds an aperture 208 in the second multi-aperture array 126, so that each re-imaged electron beamlet from the first multi-aperture array 116 will pass through or partially pass through a corresponding aperture 208 in the second multi-aperture array 126.

It is noted that the angular distribution and the angular deflections of the electron lenses shown in FIG. 2 are shown much larger than they are in reality for purposes of illustration. A beam deflector 128 located between the first multi-aperture array 116 and the second multi-aperture array 126 deflects all of the electron beamlets 204 uniformly at the plane of the second multi-aperture array 126. The enlargement 210 shows a portion 212 of the deflected electron beamlet 204 being intercepted by an aperture 208 of the multi-aperture array 126. The interception of a portion 212 of the deflected electron beamlet 204 causes the shape of the electron beamlet 204 to change as it passes through the multi-aperture array 126. The details of the shape change of the electron beamlet 204 will be discussed below in conjunction with FIGS. 5A–5C.

The reshaped electron beamlet 214 emerging from the second multi-aperture array 126 is re-imaged onto the plane of the ABAA 132 by electron lens elements 124 and 138. For each reshaped electron beamlet 214 emerging from an aperture of the second multi-aperture array 126, there is a corresponding aperture 216 in the ABAA 132. As enlargement 218 illustrates, since a portion 212 of the original electron beamlet 204 was intercepted by the second multi-aperture array 126, the electron beamlet does not fill the corresponding aperture 216 of the ABAA 132. In fact, even if the full electron beamlet 204 was presented to the aperture 216 in the ABAA 132, the electron beamlet would not completely fill the aperture 216. The apertures in the first multi-aperture array 116, the second multi-aperture array 126 and the ABAA 132 are sized such that the apertures 216 in the ABAA 132 do not define the beamlet size or shape. Ideally, none of the electrons in the electron beamlet 214 strike the structure of the ABAA 132. The only function of the ABAA 132 is to blank selected electron beamlets. The x-ray baffle 140 shown disposed between the second multi-aperture array 126 and the ABAA 132 is preferentially located in the back focal plane of electron lens element 138.

Figure 3:
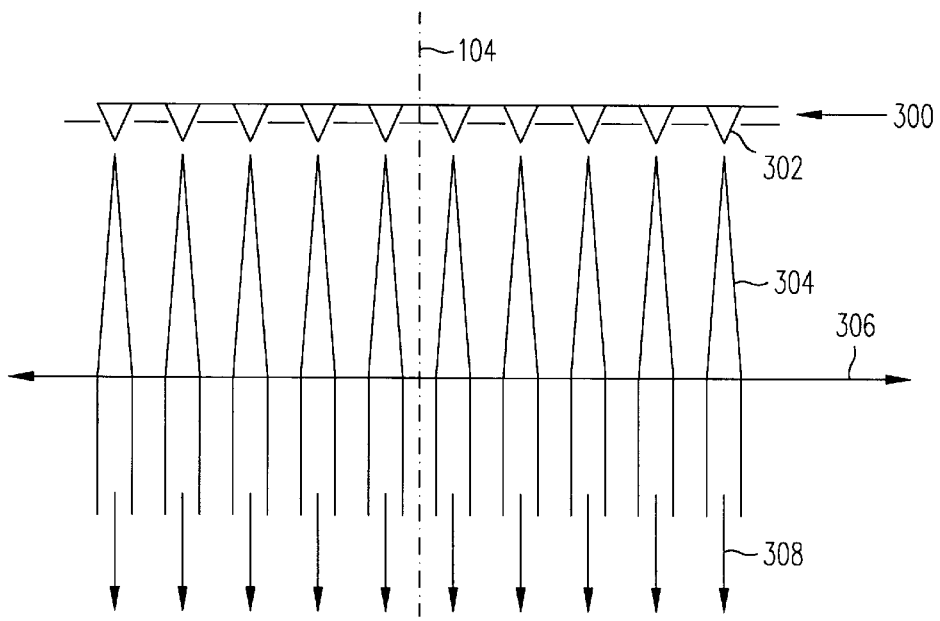
FIG. 3 illustrates an electron source having a plurality of sources of electron beamlets.
Figure 4:
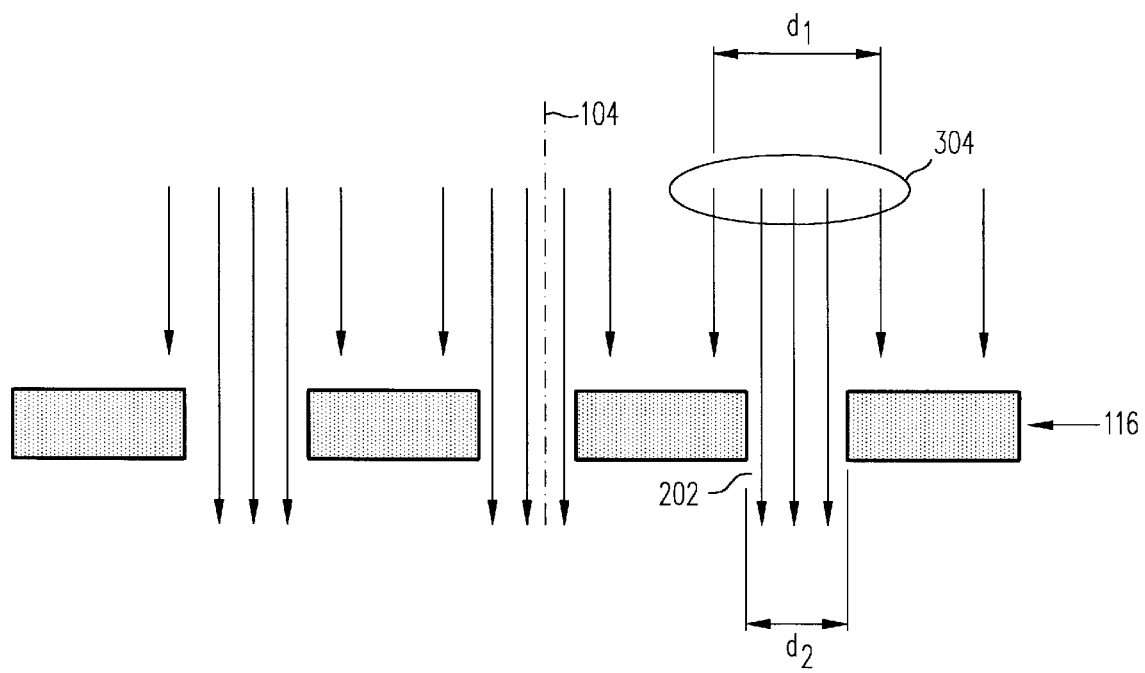
FIG. 4 shows a cross-section of a portion of a multi-aperture array and electron beamlets as they pass through apertures in the multi-aperture array.

Referring to FIGS. 3 & 4, an alternative source of electrons to that shown in FIG. 1 is illustrated. FIG. 3 shows a beam generator 300 having a plurality of sources 302 that are arranged in an array. The plurality of sources 302 generate a plurality of electron beamlets 304 that are divergent and that are directed downwardly, in a direction generally parallel to the system axis 104. An electron lens element 306 acting as a condenser substantially collimates the electron beamlets 304 downwardly in a direction parallel to the system axis 104 as indicated by arrows 308.

FIG. 4 illustrates the formation of electron beamlets with uniform intensity from the electron beamlets formed in FIG. 3. In order for the electron beamlets 304 to have a uniform intensity over their entire cross-section, the size $d_1$ of each of the electron beamlets 304 generated by the plurality of sources 302 and collimated by the electron lens element 306 must be larger than the size $d_2$ of the individual apertures 202. If the plurality of sources 302 provide a relatively flat-topped distribution of electrons at the first multi-aperture array 116, electrons then strike the array 116 only in the vicinity of the apertures 202, and therefore the total number of electrons striking the first multi-aperture array 116 is reduced. As can be appreciated, the multi-aperture array 116 must be capable of withstanding the elevated temperature caused by the incident electrons. However, in comparison with the electron source discussed above in conjunction with FIG. 1, the smaller number of electrons incident upon the first multi-aperture array 116 will substantially reduce the required elevated temperature capability of the first multi-aperture array 116. Some possible examples of advanced cathodes that produce beamlets at each multi-aperture location are p-n junction arrays, a photocathode illuminated with a periodic array of light beams, and field emission arrays.

Each source of the multiple beam let electron sources shown in FIG. 3 can have more conventional emittance properties for each electron beamlet. The required beam angle is essentially the same as calculated above. However, the beam size needed at the ABAA is much smaller, only about the size of one ABAA aperture, rather than the entire ABAA. This reduces the required emittance per electron beamlet by a factor of approximately $1.5 \times 10^{-7}$ from that of the single gun illuminating the entire array as shown in FIG. 1.

The use of advanced cathodes that produce beamlets at each multi-aperture location reduces the heat dissipation requirement of the first multi-aperture array 116, as well as reduces the required total cathode current. In addition, some advanced cathodes are capable of rapid changes in emitted current. This means that as the size of the variable shaped beamlets changes, the total current to the wafer could be adjusted to maintain it at the limit imposed by Coulomb interactions. Thus, exposures employing small beamlet sizes would require shorter exposure times than those with large beamlet sizes (since resist exposure time is inversely proportional to electron beam current density, and, in the above scheme, current density will be inversely proportional to beamlet size). This would maximize throughput.

Referring now to FIGS. 5A–5C, the relationship between the first multi-aperture array 116 and the second multi-aperture array 126 is illustrated. FIG. 5A is a plan view of a portion 500 of the first multi-aperture array 116 showing the shape of the apertures 502. The size and spacing of the apertures 502 in the x direction are indicated at 501 and 503. The size and spacing of the apertures 502 in the y direction are indicated at 505 and 507. FIG. 5B is a plan view of a portion 504 of the second multi-aperture array 126 showing the shape of the apertures 506. The size and spacing of the apertures 506 in the x direction are indicated at 507 and 505 and the size and spacing of the apertures 506 in the y direction are indicated at 509 and 511. It is to be understood that other shapes are comprehended by the present invention. The shapes shown in FIGS. 5A & 5B are preferred shapes, which when combined are capable of providing a majority of the shapes required in electron-beam lithography. FIGS. 5C–5I show the various shapes that can be achieved by superimposing a portion of the first shape 502 shown in FIG. 5A over a portion of the second shape 506 shown in FIG. 5B. The shaded portion in each diagram shown in FIGS. 5C–5I represents the resultant shape of the electron beamlets that pass through the second multi-aperture array 126. The shaded portion 508 in FIG. 5C writes a triangle on the surface to be exposed 106, as do shaded portions 510 (FIG. 5D), 512 (FIG. 5E), and 514 (FIG. 5F). The size and orientation of the triangles 508, 510, 512, and 514 depend upon the direction and amount of deflection provided by the electron deflector 128. The shaded portion 516 (FIG. 5G) writes a square or a rectangle on the surface to be exposed 106. The size of the square 516 can be selected by varying the direction and the amount of deflection provided by the electron deflector 128. The size of the square 516 can be as large as the aperture 506 (FIG. 5B) which in this case is the same size as the lower portion, indicated at 501, (FIG. 5A) of the aperture 502. The shaded portion 518 (FIG. 5H) writes a horizontal rectangle on the surface to be exposed 106 and the shaded portion 520 (FIG. 5I) writes a vertical rectangle on the surface to be exposed 106. The narrow horizontal rectangle 518 and the narrow vertical rectangle 520 can be parts of a line on the surface to be exposed 106.

It can be seen from FIGS. 5A & 5B that the aperture 502 in the first multi-aperture array 116 has five times the area of aperture 506 in the second multi-aperture array 126.

Figure 6A:
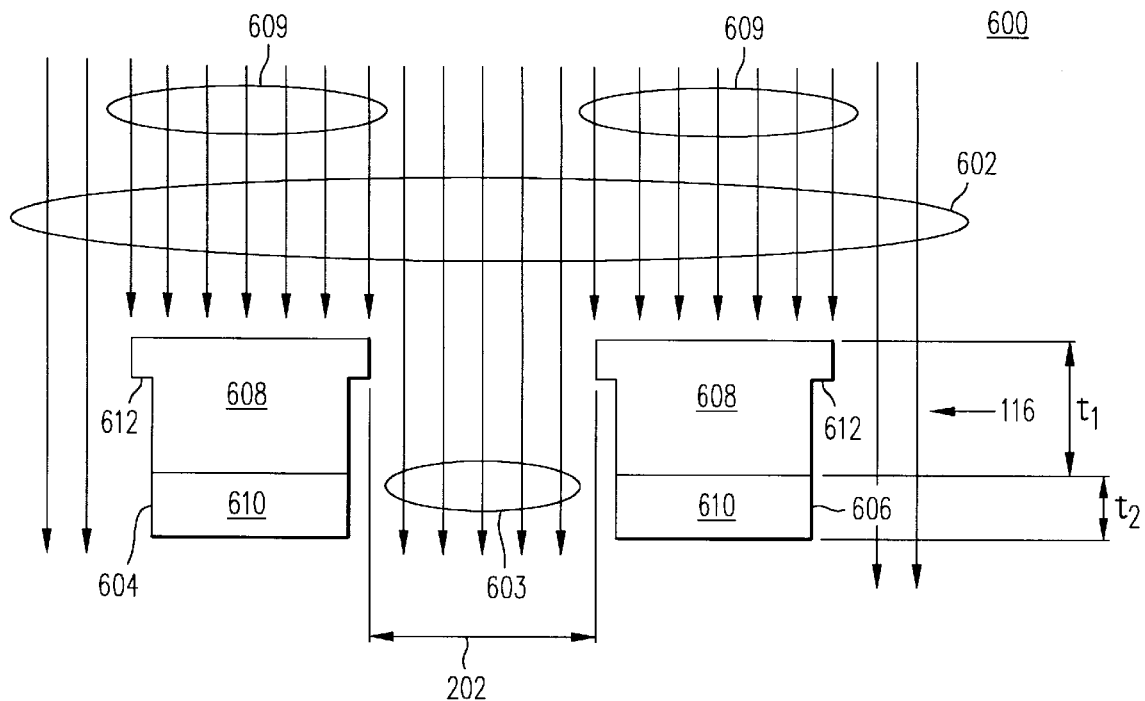
FIG. 6A is a cross-sectional view of a portion of a first embodiment of the first multi-aperture array illustrating the formation of electron beamlets from an incident beam of electrons.

Referring to FIG. 6A there is shown a cross-sectional view of a section 600 of a first embodiment of the first multi-aperture array 116. A substantially collimated beam of electrons 602 is shown being directed downwardly onto the two portions 604 and 606 of the first multi-aperture array 116. As portions of the electron beam 602 pass through an aperture 202 in the first multi-aperture array 116 an electron beamlet 603 is formed. The electron beamlet 603 has a shape that is the same as the shape of the aperture 202 in the first aperture array 116. The multi-aperture array 116 is constructed to absorb electrons and minimize the generation of x-rays resulting from the electrons striking the multi-aperture array 116.

A preferable construction of the multi-aperture array 116 is with a first layer 608 having a thickness $t_1$ of a low atomic number material, such as silicon that has an atomic number z of 14, which will minimize the generation of x-rays and a second layer 610 having a thickness of $t_2$ of a high atomic number material, such as gold that has an atomic number z of 79. The first layer 608 absorbs a percentage of the incident electrons 609 while the high atomic number material in the second layer 610 provides strong x-ray absorption for those x-rays generated by the electrons striking the first layer 608 and other x-rays generated at other portions of the electron beam lithography system 100. The nominal thickness of the top layer 608 necessary to stop the impinging electrons is approximately 50–100 microns and depends upon the energy of the electrons. In order to reduce electron scattering from the vertical edges of the openings, part of the top layer 608 is recessed a small distance 612. Although the x-ray flux from this edge region is higher, the total area affected is not large. The thickness of the second layer 610 is approximately 10 microns. The thicknesses of the top layer 608 and the bottom layer 610 may be varied depending upon the overall design of the electron beam lithography system.

Other factors that must be considered in determining the thicknesses, $t_1$ and $t_2$, of the first multi-aperture array 116, include what type of electron source is being used and whether a shield is being used. For example, if a shield is not being used and an electron source is used as discussed above in conjunction with FIG. 1, the first multi-aperture array 116 will be uniformly illuminated. Because only a small fraction of the electrons in the incident electron beam (approximately 5/16) pass through the apertures, the majority of the electrons must be absorbed by the first multi-aperture array 116. For example, if the beam current at the wafer is required not to exceed 30 microamps, to avoid blurring and distortion of the image from coulomb interactions, the beam current at the first multi-aperture array 116 must be no more than 480 microamps. The difference between these values represents the amount of beam current deposited on the multi-aperture arrays under the condition of maximum beamlet size. At 100 kV this amounts to a power dissipation of 33 watts in the first multi-aperture array. This power level will heat the first multi-aperture array 116 to a high temperature. Heating of the bilayer structure of multi-aperture array 116 may cause distortion because the materials of the two layers have different coefficients of expansion. For this reason, a shield may be required or a single material may be used, which may lead to increased x-ray generation.

Figure 6B:
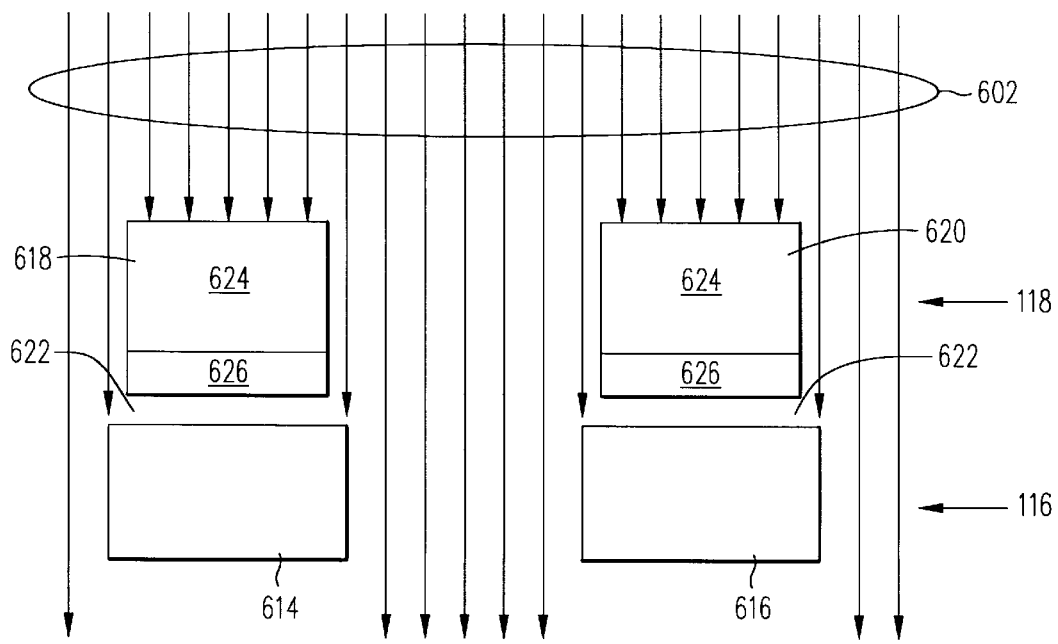
FIG. 6B is a cross-sectional view of a portion of a second embodiment of the first multi-aperture array having an associated multi-aperture array shield and illustrating the formation of electron beamlets from an incident beam of electrons.

Referring to FIG. 6B, there is shown a cross-sectional view of two portions 614 and 616 of a second embodiment of the first multi-aperture array 116. Also shown is a cross-sectional view of two portions 618 and 620 of the shield 118 that protects the first multi-aperture array 116 from being impacted by electrons. Collimated electrons are shown being directed downwardly onto the two portions 618 and 620 of the shield 118. The shield 118 can be constructed of any material that can absorb electrons and is capable of withstanding an elevated temperature caused by the electron current. Preferably, the shield 118 is constructed in such a way that the shield 118 can absorb electrons, can withstand high temperatures without substantial warping, and can minimize the generation of x-rays caused by the electrons striking the shield 118. The shield portions 618 and 620 have smaller dimensions than the multi-aperture array portions 614 and 616 as indicated at 622, that is, the shield apertures are larger than those of the multi-aperture array. The shield 118 has smaller dimensions than the multi-aperture array 116 so that the latter apertures and not the apertures in the shield 118 define the shape of the beamlets. In order to minimize x-ray generation by electrons striking the shield 118, the shield 118 may have the same structure as described above for the first multi-aperture array 116, that is, with a layer 624 of a low atomic number material followed by a layer 626 of a high atomic number material.

Figure 7A:
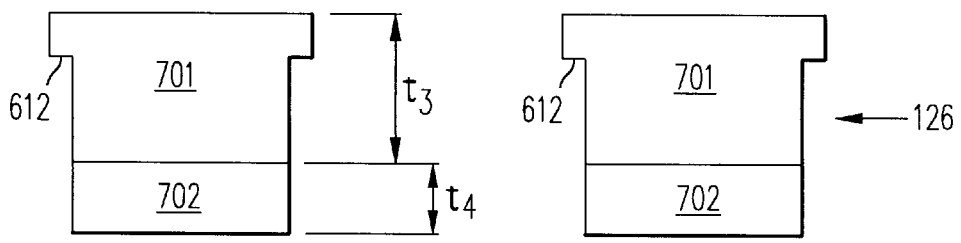
FIG. 7A is a cross-sectional view of a portion of a first embodiment of the second multi-aperture array.
Figure 7B:
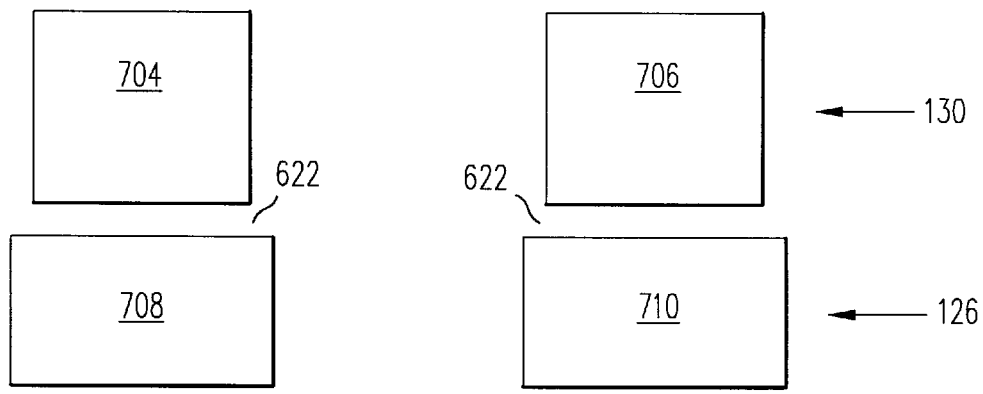
FIG. 7B is a cross-sectional view of a portion of a second embodiment of the second multi-aperture array having an associated multi-aperture array shield.
Figure 7C:
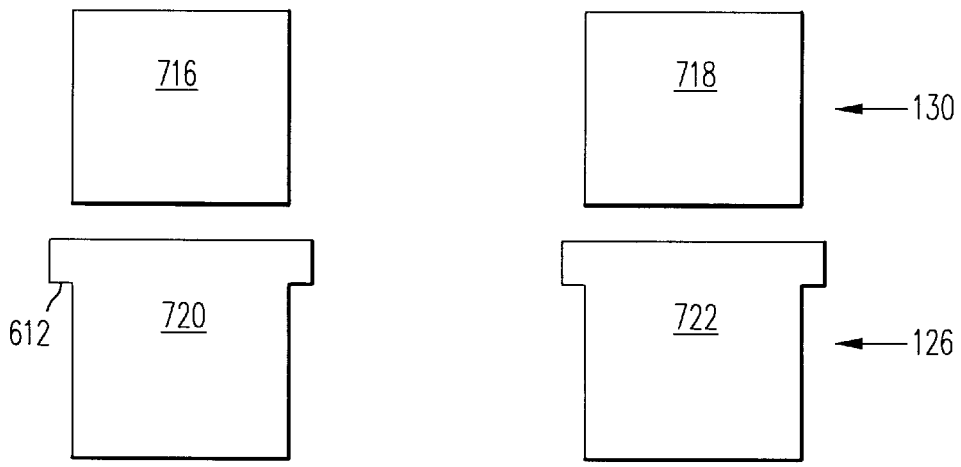
FIG. 7C is a cross-sectional view of a portion of a third embodiment of the second multi-aperture array also having an associated multi-aperture array shield.

Referring to FIGS. 7A–7C there are shown cross-sectional views of three embodiments of the structure of the second multi-aperture array 126. The first embodiment shown in FIG. 7A is similar to the structure shown in FIG. 6A. The second embodiment shown in FIG. 7B is similar to the structure shown in FIG. 6B. The embodiment shown in FIG. 7A has a first layer 701 having a thickness $t_3$ of a material having a low atomic number and a second layer 702 having a thickness $t_4$ of a material having a high atomic number. The thicknesses $t_3$ and $t_4$ are determined as discussed above in conjunction with FIG. 6A. The embodiment shown in FIG. 7B shows two portions 704 and 706 of the shield 130 and two portions 708 and 710 of the second multi-aperture array 126. The two portions 708 and 710 of the multi-aperture array 126 is constructed from a material as discussed above in conjunction with FIG. 6B. The embodiment shown in FIG. 7C shows two portions 716 and 718 of the shield 130 and two portions 720 and 722 of the second multi-aperture array 126. The shield 130 is constructed as discussed above in conjunction with FIG. 7B. The second multi-aperture array 126, shown in FIG. 7C, is constructed as discussed above in conjunction with FIG. 7A with or without the second layer 702 shown in FIG. 7A.

Figure 8:
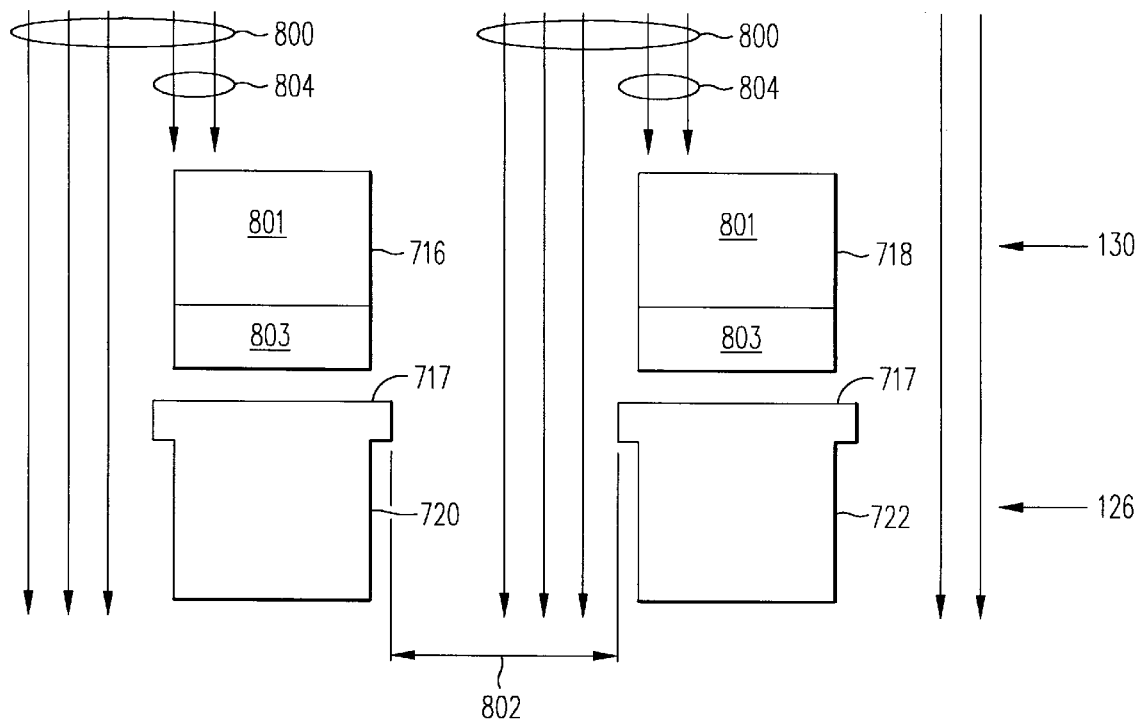
FIG. 8 is a cross-sectional view of a portion of the embodiment of the second multi-aperture array and a portion of the associated multi-aperture shield shown in FIG. 7C with the electron beamlets having been deflected before they reach the second multi-aperture array.

Referring to FIG. 8 there is shown a similar cross-sectional view of the section of the second multi-aperture array 126 and the section of the associated shield 130 as shown in FIG. 7C with the exception that the shield 130 has a first layer 801 and a second layer 803 constructed as discussed above in conjunction with FIG. 6A. As discussed above, the electron deflector 128 deflects each electron beamlet 800 a selected distance and a selected direction from the center of the apertures 802 in the second multi-aperture array 126. Because each electron beamlet 800 is deflected away from the center of the apertures 802 in the second multi-aperture array 126, a portion 804 of each electron beamlet 800 will strike the shield portions 716 and 718 as well as the unprotected regions, indicated at 717, of the portions 720 and 722 of the multiaperture array. If the first multi-aperture array 116 transmits ⁵⁄₁₆ths of the electron beam, then the second multi-aperture array 126 intercepts from ⁴⁄₁₆ths (beamlet 204 completely fills aperture 506 of the second multi-aperture array 126) to ⁵⁄₁₆ths (beamlet 204 is deflected completely out of aperture 506) of the electron beam. This leads to power dissipation of from 12 to 15 watts in the second multi-aperture array 126 in the absence of a shield. If a shield is present, the power dissipated is shared between the shield and the narrow regions of the multi-aperture array around the apertures that are not covered by the shield. In either case, it is necessary for either the second multi-aperture array 126 or the shield 130 to have the capability to withstand the elevated temperature that result from bombardment by the incident electrons.

Electron beam power dissipation in the various apertures and shields is an important design issue. The x-ray intensities are too small to contribute any heating. Assuming that the beam current distribution at the first multi-aperture array 116 is uniform, only a small fraction of the electron current reaches the surface to be exposed 106. In the absence of a shield 118, most of the beam current hits the first multi-aperture array 116 and is dissipated. This causes the first multi-aperture array 116 to be heated. As discussed above, for an average beam current at the wafer of 30 microamps, the beam current at the first multi-aperture array 116 is 480 microamps. This results in power dissipation in the first multi-aperture array 116 of about 33 watts. This assumes that ¹¹⁄₁₆ of the beam hits the first multi-aperture array 116. The power dissipation will heat the first multi-aperture array 116 to a high temperature. In a vacuum, cooling occurs only by conduction and radiation. If only radiation cooling occurs, and the area illuminated by the beam is approximately $(2.5 \text{ cm})^2$, then the temperature of the first multi-aperture array 116 could reach 735 degrees centigrade. The temperature of the melting point of silicon is 1410 degrees centigrade. The gold layer may increase the thermal conductivity significantly and lower the temperature. However, the double layer may cause thermal distortion. Another method to decrease the temperature is to increase the area of the first multi-aperture array. This method would require greater demagnification of the image from the aperture array to the surface to be exposed.

A similar calculation for the second multi-aperture array 126 leads to a maximum power dissipation of 15 watts and a radiation limited temperature rise above ambient of approximately 520° C.

These considerations illustrate the need for a thermal shield. The shield does not have to stop all electrons—if it absorbs 80–90% of the electron energy, the temperature of the multi-aperture array is greatly reduced. Any temperature rise in the multi-aperture arrays will cause thermal expansion, leading to an increase in the aperture dimensions and a displacement of their centers. These changes will affect the image on the surface to be exposed 106. However, the image at the ABAA 132 can be demagnified by a large factor such as 100. Furthermore, there may be additional demagnification between the multi-aperture array 126 and the ABAA 132. This means that the effects of thermal distortions at the first and second multi-aperture arrays, 116 and 126, respectively, are reduced in magnitude by at least a factor of 100 at the surface to be exposed 106. Therefore, heating of the multi-apertures 116 and 126 is unlikely to perturb the final image properties appreciably.

Referring again to FIG. 1, each electron beamlet, after passing through the beam shaping section 108, is directed towards the beam blanking section 110. The beam blanking section 110 includes an ABAA 132, an upper shield 134 to protect the ABAA 132, and can include a lower shield 136 to further protect the ABAA 132. An electron lens element 138 acts as an electron condenser lens to focus each electron beamlet on a corresponding aperture in the ABAA 132. The ABAA 132 has m rows and n columns of apertures. An x-ray baffle 140, which absorbs many of the x-rays generated in the column above it is located between the second multi-aperture array 126 and the electron lens element 138. The x-ray baffle 140 is preferably located at the back focal plane of the condenser lens element 138.

Figure 9:
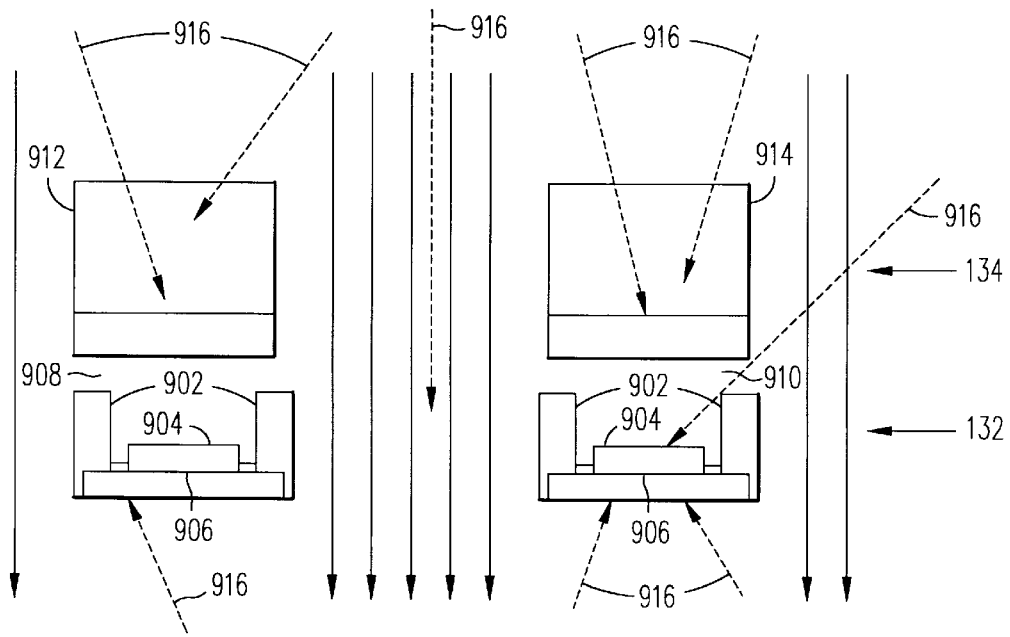
FIG. 9 is a cross-sectional view of a portion of a first embodiment of the active beam aperture array and a portion of a shield for the active beam aperture array.

Referring to FIG. 9, a first embodiment of ABAA 132 includes deflectors 902 and deflector logic 904 on an upper surface 906 of the ABAA 132 associated with each aperture in the ABAA 132. Two portions 908 and 910 of the ABAA 132 and two portions 912 and 914 of the upper shield 134 are illustrated. X-rays, indicated by the dotted lines 916, are shown impinging upon various structures including the portions of the ABAA 132 and the shield 134. The function of the shield 134 is to protect the ABAA 132 from being struck and damaged by the x-rays generated in structures in the lithography system upstream from the shield 134. As is indicated, the shield 134 protects the ABAA 132 from being struck by a majority of the generated x-rays with only a few x-rays striking the deflection logic 904. The function of the ABAA 132 is to blank selected electron beamlets. To "blank" a selected electron beamlet means that the selected electron beamlet does not reach the surface to be exposed. This is accomplished by the deflectors 902, which are controlled by the deflection logic 904. The deflectors 902 and deflection logic 904 deflect the selected electron beamlets to an extent that the selected electron beamlets strike a contrast aperture downstream from the ABAA 132.

Figure 10:
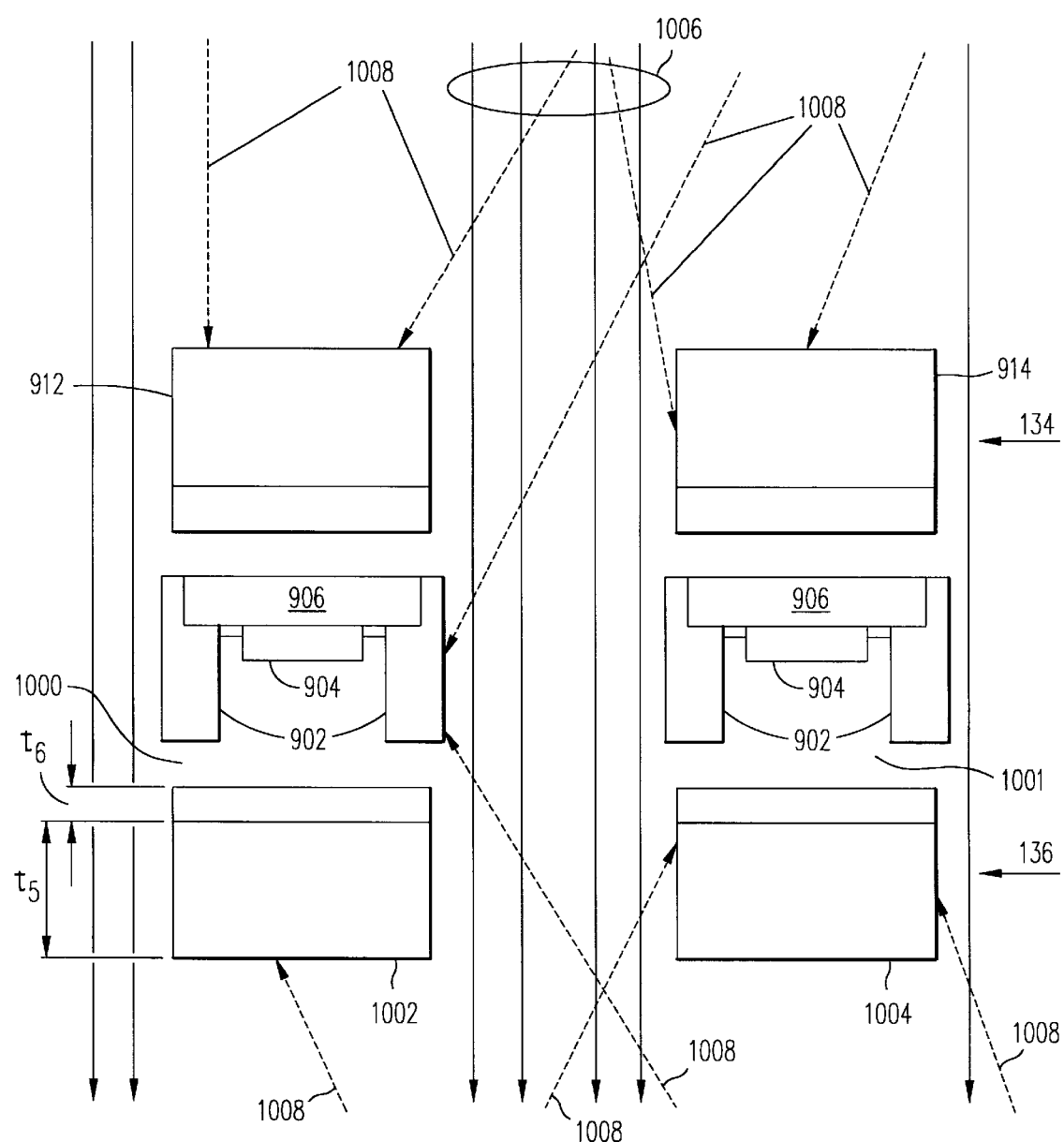
FIG. 10 is a cross-sectional view of a second embodiment of the active beam aperture array and portions of shields above and below the active beam aperture array.

Referring to FIG. 10 there is shown a second embodiment of the ABAA 132. Two portions, 1000 and 1001, of the ABAA 132 are shown with the deflectors 902 and deflector logic 904 located on the bottom side of the ABAA 132. Also shown are two portions 1002 and 1004 of the second shield 136 located beneath the ABAA 132. The main purpose of the lower or second shield 136 is to protect the deflector logic 904 and the underside of the ABAA 132 from x-rays that are generated by electrons striking structures downstream from the ABAA 132. The downstream structures that generate a majority of x-rays are the contrast aperture (to be described below) and the surface to be exposed 106. The second shield 136 as well as the upper shield 134 may be constructed of a first layer of a low atomic number material, such as silicon, having a thickness $t_5$ and a second layer of a high atomic number material, such as gold, having a thickness $t_6$. It should be understood that the first layer is above the second layer for the upper shield, while it is below the second layer for the lower shield. Because a significant number of electrons are not expected to be backscattered, the first layer in the lower shield may be for structural purposes only to support the layer of gold, which is to protect the deflector logic 904 from x-rays generated by electrons striking downstream structures. The electron beamlets are indicated at 1006. The x-rays are indicated by dashed lines 1008 and as illustrated can originate at various locations and have many directions.

Under the conditions in the lithographic system column, x-ray exposure of the circuitry in the ABAA beam deflector logic 904 will not cause single beamlet blanking errors, which could create errors in the final image. The reason is basically that a photoelectron from a single x-ray does not deposit enough charge within the active region of a circuit to change its logic state. A large number of such events are required, and the periodic resetting of the logic circuits during pattern exposure prevents accumulation of appreciable amounts of charge. Similar comments apply to the low intensity of scattered electrons, which may strike the ABAA 132. Instead the x-rays will gradually change voltage levels in the circuitry by creating holes (from electron-hole pairs) which become trapped in the silicon oxide layers, until logic functions are affected over a period of time.

Because it is virtually impossible to prevent every x-ray from hitting the deflector logic 904, the deflector logic 904 has a finite lifetime. Therefore, it is desirable to utilize radiation hardening to achieve a longer lifetime of the deflection logic 904. This technique is described in, for example, W. Dawes et al., "Hardening Semiconductor Components Against Radiation and Temperature," (Noyes Data Corporation, 1988). For CMOS technology, it is possible to design circuitry to tolerate cumulative doses of at least 100 krad(Si), where 1 rad(Si)=0.01 J/kg of absorbed energy in silicon. For example, if 100 krad(Si) is assumed, for a lifetime of 1 year full time operation (1 year equals approximately 3.14E7 seconds), the instantaneous dose must be less than approximately 0.003 rad(Si)/sec. The design of the present invention is expected to reduce the x-ray dose well below this limit, and thus the present invention achieves more than a one-year lifetime.

Modeling results assuming an electron beam current sufficient to provide a current at the wafer of 30 microamperes indicate that the most serious sources of x-rays are below the active beam aperture array 132. Because most of the x-rays originate on the contrast aperture 154 and the surface to be exposed 106, the film of gold on the top surface of the shield 136 and/or the bottom surface of ABAA 132 can reduce the effect of the x-rays significantly. However, the contribution of the surface to be exposed 106 may not be significant because the contrast aperture 154 absorbs some of the x-rays generated by electrons striking the surface to be exposed 106. In addition, the electron beamlets are deflected at the wafer by the deflection system 162. This means that the region of the bottom surface of the ABAA 132 exposed to the x-rays from the surface to be exposed move synchronously with the deflected electron beamlets. This reduces the dose rate contribution from the surface to be exposed 106 by approximately the ratio of the diameter of the region illuminated on the ABAA 132, to the displacement of that region caused by the deflection. It is possible that the contrast aperture 154 may produce some backscattered electrons that may hit the ABAA 132. The total electron backscattering coefficient for silicon at 100 KeV is approximately 0.14. The backscattered electron yield and the x-ray dosage produced by the contrast aperture 154 may be reduced by providing a material with a reduced atomic number on the surface of the contrast aperture 154 that is struck by the electrons. For example, if the electrons hit a region of carbon such as pyrolytic graphite, which has an atomic number of 6, both the x-ray and backscattered electron yields would be reduced by approximately the factor 6/14 (the ratio of the atomic numbers)=0.43. A small plug of Be having an atomic number of 4 would give a reduction factor of 0.29. In addition, the backscattered electron energy spectrum is broad, so many of the x-rays generated will be of lower energy and thus, more easily shielded. Also, many of the lower energy electrons will be deflected away from the ABAA 132 and it shields 136 by intervening electron lens elements.

Referring to FIG. 11A, a partial schematic of a portion of the ABAA 132 is shown. The ABAA 132 can have a large number of apertures, because locating the integrated logic unit 1102 adjacent to each aperture minimizes the number of connections that need to be routed through the aperture array. Each aperture 1100 has the electronic logic unit 1102 integrated into the aperture plate adjacent to each aperture

1100. The ABAA 132 is very large and can have on the order of $10^6$ apertures 1100. It is noted that the electronic complexity of the ABAA 132 is comparable to that of a 1 Mbit SRAM. In the case of the present invention, with regard to fabricating this circuitry the minimum feature size of the electronic circuits is approximately 1.2 µm. This feature size is readily available in existing semiconductor manufacturing foundries. Therefore, manufacturability of the ABAA should not be an issue. The available space for electronic logic unit 1102 is approximately 100 µm². The integrated electronic logic unit 1102 allows rapid addressing and updating. Row and Column drives, 1104 and 1106, respectively, address each electronic logic unit 1102. The integrated electronic logic units 1102 control deflectors 1108 in FIG. 11A adjacent to each aperture 1100 and selectively deflect the electron beamlets as they pass through the associated apertures 1100.

It is reiterated that the large number of apertures in the ABAA 132 is made possible by locating the deflection logic units 1102 adjacent to each aperture 1100. The main reason is the simplification in connecting the deflectors to the pattern logic. In the above example, an array of $10^6$ apertures requires a total of only 2000 Row and Column lines to select each aperture uniquely. In contrast, in a passive array, where each aperture is selected from a remote logic location, a total of $10^6$ electrical connections are required to access all the apertures. There is no practical way to route so many lines through the aperture array without increasing the distance between the apertures to a great extent. In practice, passive arrays have been limited to approximately 1000 apertures arranged to be approximately one-dimensional.

The integrated electronic logic unit 1102 could consist of a simple gate to turn on the associated deflectors to deflect the electron beamlet as it passes through an associated aperture. However, if a simple gate is used, time will be lost at the end of each exposure, while the next pattern logic is loaded into the gates. Because this delay decreases throughput, it is preferable for a memory unit to be included in the integrated electronic logic unit 1102 so that the next pattern logic can be "latched" into the circuitry during the present exposure.

Figure 11B:
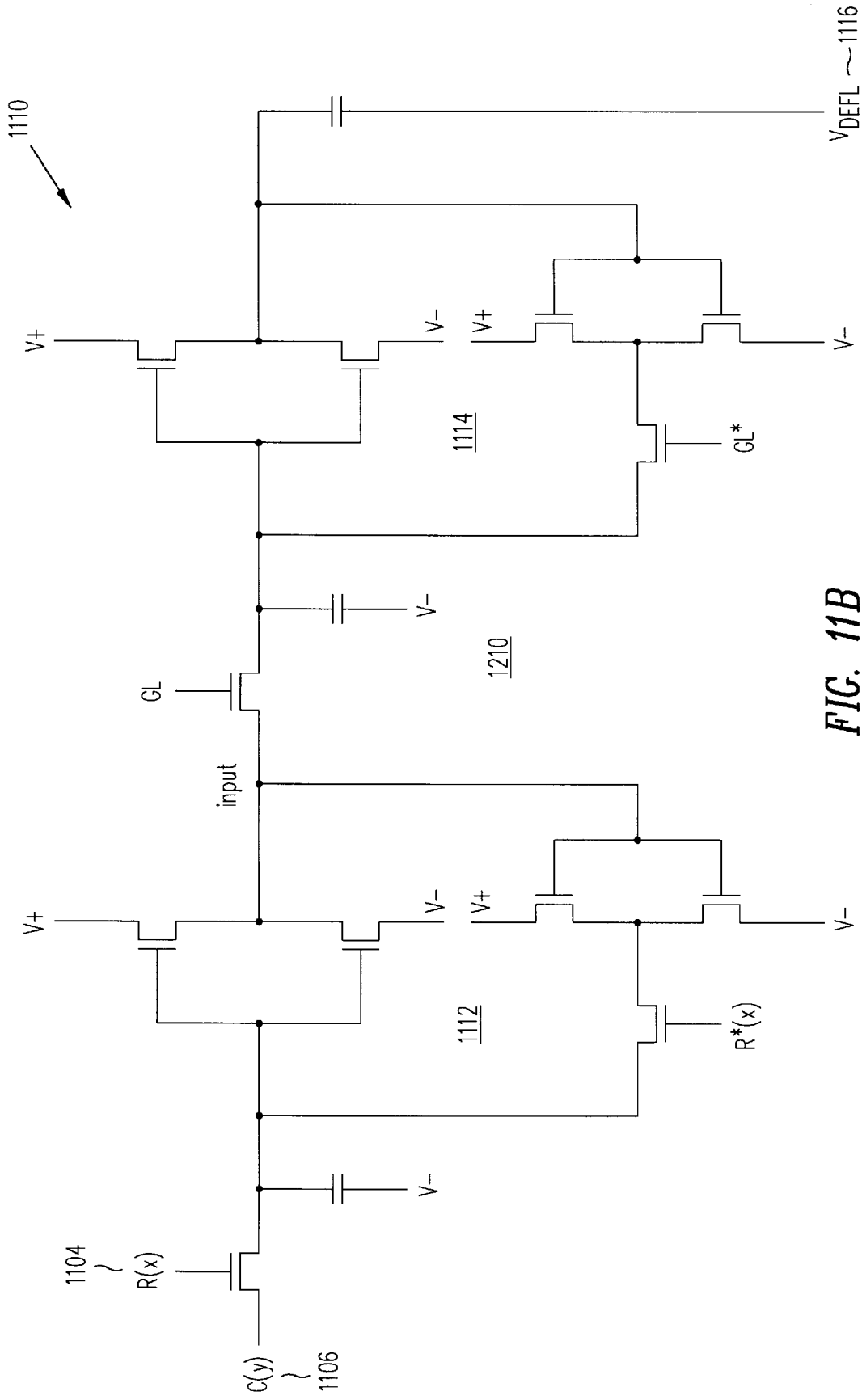
FIG. 11B is a schematic of a latched SRAM that controls the deflection of an electron beamlet passing through the associated aperture in the active beam aperture array.

FIG. 11B shows a schematic of an SRAM based latch 1110 that can be used as the integrated electronic logic unit 1102, to store the next pattern logic and update the deflection voltage $V_{DEFL}$ at the appropriate time. A number of circuits are feasible for use as the logic circuit that implements the above delineated design considerations. The SRAM based design shown in FIG. 11B is one of the preferable designs for several reasons, including the reason that the SRAM architecture can be made more radiation hardened than a DRAM design, and the pattern latch feature eliminates the pattern update overhead time. The larger unit cell size caused by the necessity of using 6 pMOSFETs and 6 nMOSFETs means that the system demagnification must be approximately 134 rather than 100 in order that the basic beam size at the wafer be 0.1 µm. Alternatively, the minimum feature size of the circuitry could be reduced. The row drive R(x) 1104 and the column drive C(y) 1106 address each electronic logic unit 1102. R*(x) is the inverse of R(x), V+ and V− are global bias voltages and GL and GL* are latch signals that shift the deflection state from the first stage 1112 of the latch 1110 to the second stage 1114 of the latch 1110. The $V_{DEFL}$ 1116 is deflection voltage.

Referring again to FIG. 1, the electron beamlets that are not blanked are directed downwardly towards the surface to be exposed 106 by the electron lens group 112 that demagnifies and focuses the electron beamlets onto the surface to be exposed 106. The electron lens group 112 includes a first symmetric magnetic doublet 142 that includes a first electron lens element 144 and a second electron lens element 146. The properties of the symmetric magnetic doublet are described in a paper by M. B. Heritage, *Journal of Vacuum Science Technology* 12, 1135 (1975). The electron lens group 112 also includes a second symmetric magnetic doublet 148 that includes a first electron lens element 150 and a second electron lens element 152. A contrast aperture 154 is shown disposed at the crossover plane of the first symmetric magnetic doublet 142. The purpose of the contrast aperture 154 is to absorb the electron beamlets that have been blanked by the ABAA 132. The dashed line 156 represents the electron beamlets that have been blanked.

Also shown is an alternative location at the crossover plane of the second symmetric magnetic doublet 148 for a contrast aperture 158. The dotted line 160 represents the path of the electron beamlets that have been blanked and which are not absorbed until they strike the contrast aperture 158. The positioning of the contrast aperture 158 at the crossover of the second symmetric magnetic doublet 148 helps to prevent the x-rays generated by the electrons striking the contrast aperture 158 from reaching the deflection logic 904. Since the contrast aperture 158 eliminates the blanked electrons from the beam, its location is likely to affect the magnitude and nature of coulomb interactions between the electrons, which can cause both image blurring and distortion.

A deflection system is shown at 162 that acts to move the electron beamlets over the surface to be exposed 106. The surface to be exposed 106 is mounted on a moving stage 164. A control section is shown at 113. The control section 113 includes controller circuit 165 that is controlled by a central processing unit (CPU) 166. The controller circuit 165 is shown having an input 168 to the electron deflector 128, an input 170 to the ABAA 132, an input 172 to the deflection system 162, and an input 174 to the moving stage 164.

An exposure pattern is created by the beam shaping section 108 and the blanking of selected electron beamlets is done at the ABAA 132. The pattern is demagnified by a large amount, M=100–200, and projected onto the surface to be exposed 106. Despite the large demagnification, the image size at the surface to be exposed 106 is relatively large because the array is large and can be on the order of 1000 rows and 1000 columns. In a particular embodiment, there are 625 rows and 625 columns, and the apertures in the ABAA 132 are large enough to permit electron beamlet sizes as large as 10 µm. Assuming a system demagnification of 100, this allows the maximum field imaged at the surface to be exposed 106 to be approximately 250 µm square. Because the apertures in the ABAA 132 are separated by spaces, the corresponding beamlets on the surface to be exposed are also separated by spaces. These spaces are filled in to make the complete pattern by deflecting the beamlets with deflectors 162 located in the electron lens group 112. The maximum deflection required is the separation between adjacent beamlets. For example, for the multi-aperture array geometries shown in FIGS. 5A & 5B, the spaces between beamlets on the surface to be exposed could be completely covered by a total of 16 exposures, or shots (including the initial exposure). For a more complicated pattern, different shaped beams, and different patterns of blanked apertures at the ABAA 132, would in general be associated with the settings of the deflectors 162. The total number of shots required is, in general, pattern dependent and may exceed 16 for sufficiently complicated patterns. After complete exposure of the 250 µm square field, the pattern in the ABAA is quickly updated, and the new pattern is exposed on an adjacent area of the surface to be exposed 106 using a deflection strategy such as a moving objective lens (MOL) to maintain image quality. The large deflections possible with a MOL or equivalent technique assists in attaining high throughputs. Appropriate motions of the wafer stage are also required for complete exposure of a chip on the semiconductor wafer. This allows the ABAA 132 to act like an electronic reticle, generating new patterns as the image is scanned over the surface to be exposed 106. This allows scanning speeds far in excess of any mechanical stage system.

Figure 12:
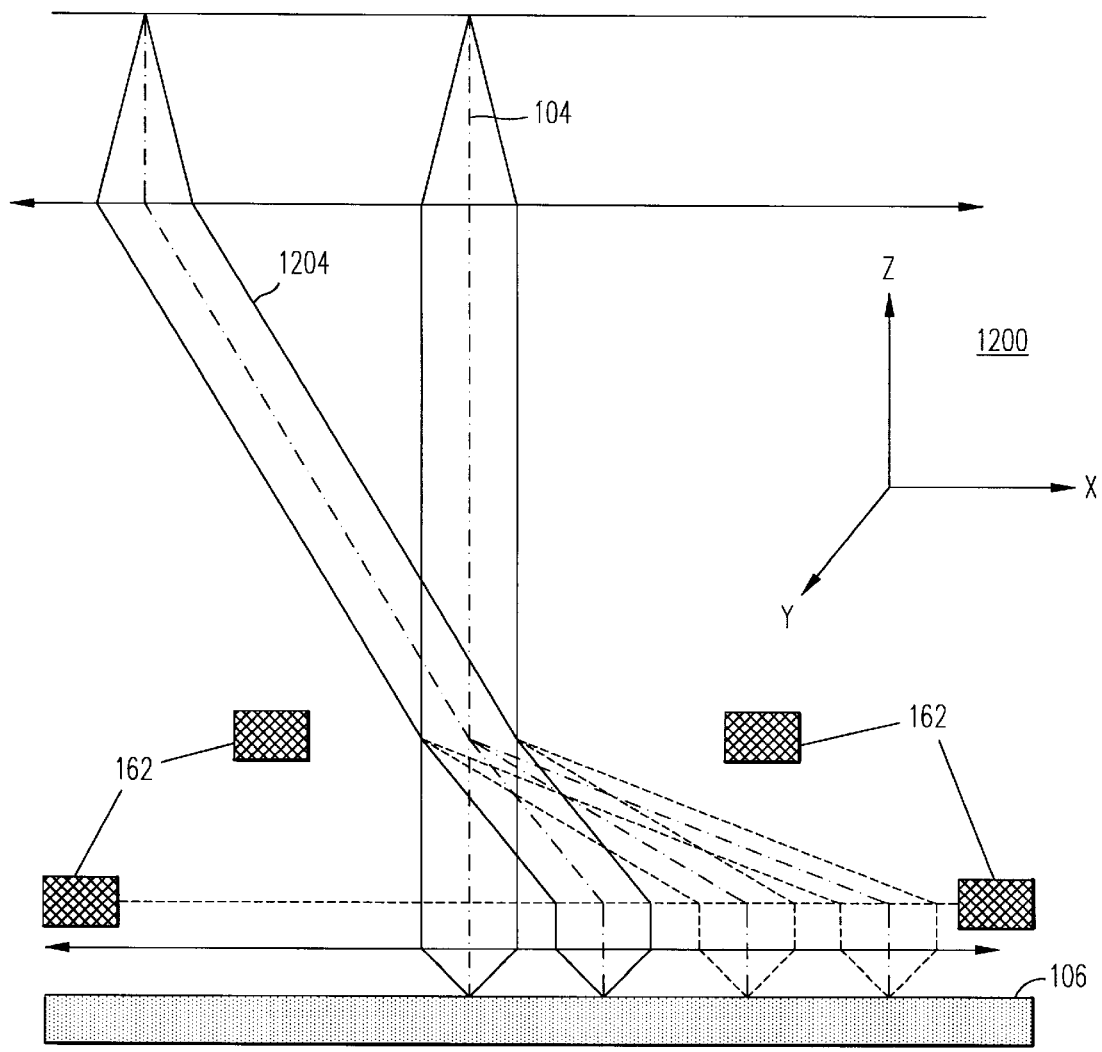
FIG. 12 illustrates the action of the deflection system acting to deflect the beamlets onto selected portions of the surface to be exposed.

Referring to FIG. 12, a preferred deflection system is an MOL system utilized to move the image on the surface to be exposed 106. The electron optical elements required to effect the MOL are not shown, however, such systems are known in the art. The coordinate system is shown at 1200. The axis of the system 104 is in the z direction, the electron beams 1204 are deflected in the x direction and the surface to be exposed 106 moves in the y direction. As discussed above, the control section 113 provides control signals to the deflection system 162 and the stage upon which the surface to be exposed 106 is mounted.

Figure 13:
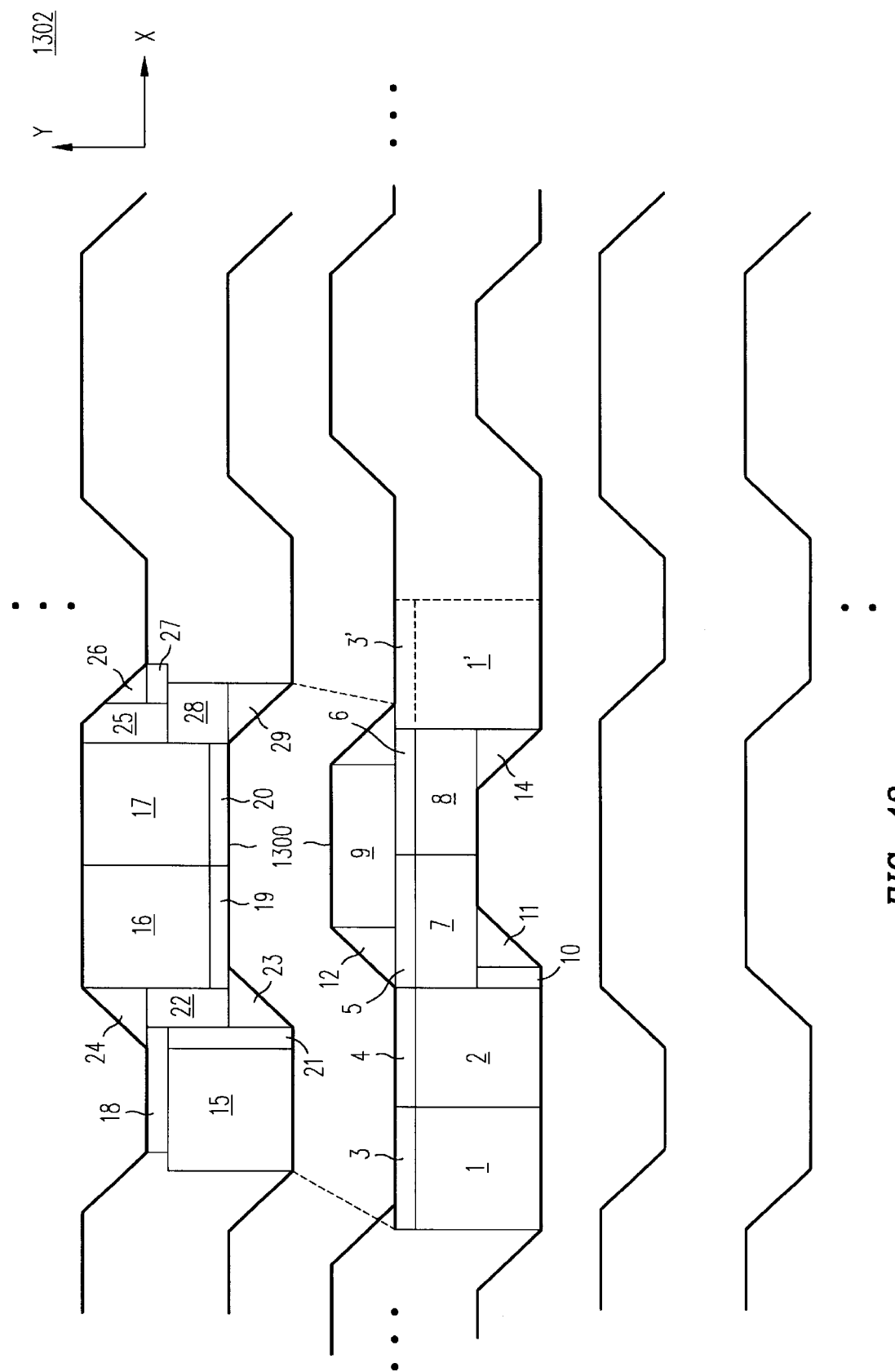
FIG. 13 illustrates portions of repetitive patterns that can be simultaneously exposed by an electron-beam lithography system in accordance with the present invention.

FIG. 13 shows an example of repetitive cells that can advantageously be exposed using the electron beam lithography system 100 of the present invention. The structures shown at 1300 represent typical structures that could be found in a semiconductor integrated circuit. For example, the structures shown could represent data lines in a DRAM. FIG. 13 is meant to imply that the pattern identified by the unprimed numbers repeats many times in both the X and Y directions, which are indicated at 1302. In this example the basic pattern area is written with a single electron beamlet, and the spacing of the electron beamlets is adjusted to the repeat distance of the basic pattern as described below. Thus, as the basic pattern is written, all equivalent patterns are simultaneously written by the corresponding electron beamlets, throughout the total exposure field of approximately 0.25 mm square. The sequence of exposures is as follows: squares labeled 1 are exposed first, then squares labeled 2, then rectangles 3 and so on until triangles 29 are exposed. Simultaneously, corresponding shapes are exposed in the other repetitive cells by their corresponding beamlets. This is illustrated by the shapes defined by dashed lines and labeled 1' and 3' in reference to shapes 1 and 3 in the basic pattern shown. If there are regions in the total exposure field that don't contain this pattern, the corresponding electron beamlets are blanked. Those patterns would be written later, and the electron beamlets used to write the above repetitive patterns would then be blanked.

Figure 14A:
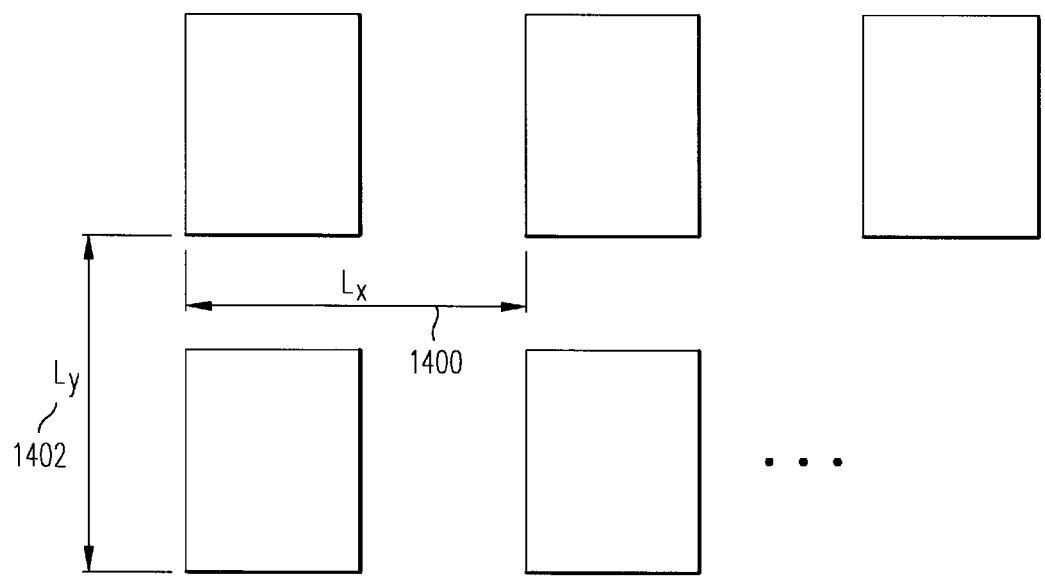
FIGS. 14A & 14B illustrate the required relationship between the spacing of the electron beamlets and the pattern repeat distance on the surface to be exposed.
Figure 14B:
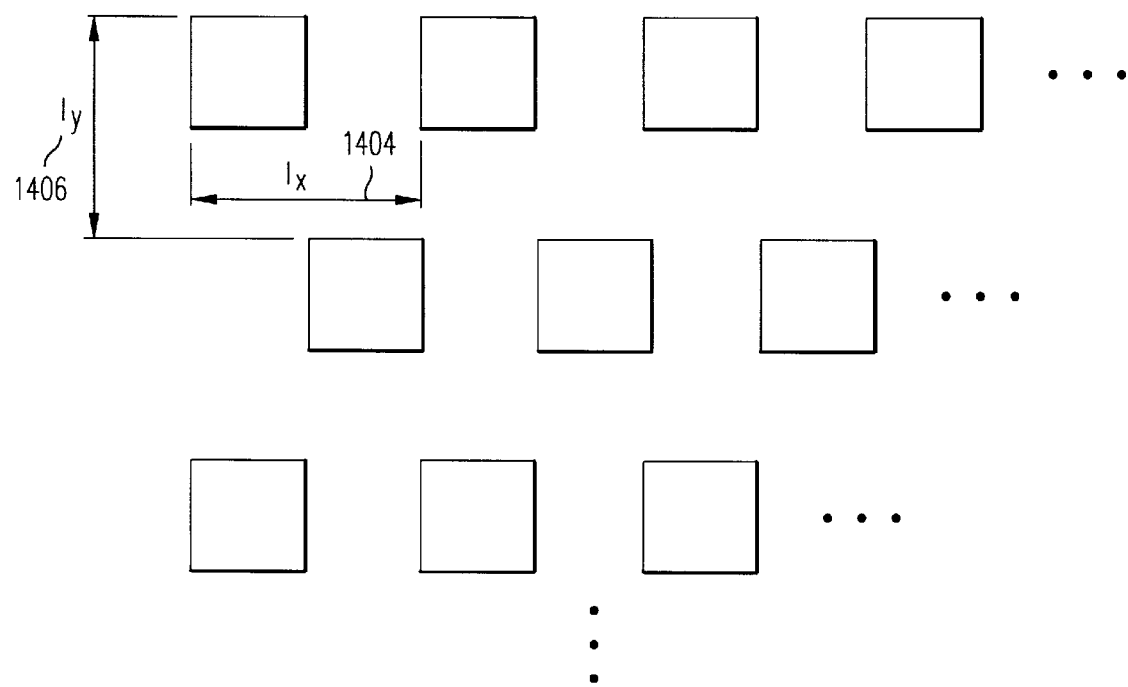

Referring to FIGS. 14A & 14B, there is illustrated the required relationship between the spacing of the electron beamlets and the pattern repeat distance on the surface to be exposed. FIG. 14A shows an example of repetitive pattern spacing $L_x$ 1400 in the horizontal direction and $L_y$ 1402 in the vertical direction on the surface to be exposed 106. FIG. 14B shows the spacing between adjacent beamlets passing through a multi-aperture array as measured on the surface to be exposed, that is, the beamlet spacing has been demagnified by the electron lens group 112. The horizontal spacing is shown as $l_x$ 1404 and the vertical spacing is shown as $l_y$ 1406. While any pattern can, in principle, be written using the concepts of this invention, it is most advantageously used to write repetitive patterns so that as many of the electron beamlets as possible can be utilized simultaneously for each exposing shot. This requires that the spacing between the beamlets have a simple integral relationship with the pattern repeat distance on the substrate being written. Examples of pattern repeat distances might be the spacing of repeating memory cells and related structures on a DRAM. In particular, if the spacing between adjacent beamlets on the substrate are $l_x$ and $l_y$ in the X and Y directions respectively, as shown in FIG. 14B they should be related to the pattern repeat distances $L_x$ and $L_y$, as shown in FIG. 14A, as follows:

$L_x = ml_x$ and $L_y = nl_y$, where m and n are integers. This relationship may be achieved either by installing an appropriate ABAA array (and corresponding multi-aperture arrays) with the appropriate spacing for the desired cell pattern or by adjusting the electron optical demagnification. In the event that the pattern to be exposed is not highly repetitive, the above strategy can not apply. However, if the pattern is designed on a uniform grid, based on the minimum feature size of the pattern or some smaller distance, a useful relation can again be established between this size and the ABAA aperture repeat spacing. If the size of the uniform grid on the pattern is given by $G_x$ and $G_y$ in the x and y directions, then the ABAA aperture repeat spacings, measured at the surface to be exposed 106, should satisfy the relations $l_x = jG_x$ and $l_y = kG_y$ where j and k are integers. In the case of repetitive patterns, such as DRAMs, the repetitive cells would be positioned according to the uniform grid. Consequently, it can be seen that the two relations discussed above which relate the ABAA aperture spacing to pattern dimensions are self-consistent.

In summary, the results and advantages of the electron-beam lithography method and system of the present invention can now be more fully realized. The electron-beam lithography method and system of the present invention provides an improved throughput in comparison to prior art methods and systems. The high throughput is achieved by having the capability of having a large array of identical electron beamlets of variable shape that are shaped by two multi-aperture arrays each having different shaped apertures. An active beam aperture array (ABAA) 132 has deflection logic associated with each aperture, which allows the ABAA 132 to be large and can be on the order of 1000 by 1000 apertures. The deflection logic associated with each aperture, which is susceptible to radiation damage, is protected by the design of the system. In addition to the availability of radiation hardening of the deflection logic, shields and baffles can be used to shield the deflection logic from x-rays generated within the lithography system. The design of the system provides that the electron beamlets are formed upstream from the ABAA 132 and therefore there are no unscattered electrons that should strike the ABAA 132.

It will also be recognized that the design of the lithography system provides a relatively long lifetime for radiation sensitive circuitry within the lithography system. The high throughput decreases the cost of the semiconductor chips produced by the system. The different shapes of the beam shaping multi-apertures provide maximum flexibility in exposing various shapes on the semiconductor wafer. The deflection logic includes a buffered latch, which allows the next pattern to be loaded into the deflection logic which the current pattern is being exposed.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electron-beam lithography system, comprising:

a source of electrons;

a stage supporting an object to be exposed by the electrons;

a beamlet shaping section disposed between the source of electrons and the object to be exposed by the electrons comprising a first multi-aperture array having m rows and n columns of apertures having a first shape and a second multi-aperture array having m rows and n columns of apertures having a second shape;

a beamlet blanking section disposed between the beamlet shaping section and the object;

a first electron lens group directing electrons emitted from the source of electrons into a collimated beam in an axial direction towards the first multi-aperture array;

a second electron lens group directing each electron beamlet in the array of electron beamlets formed by the first multi-aperture array towards the center of a corresponding aperture in the second multi-aperture array; and an electron deflector disposed between the first multi-aperture array and the second multi-aperture array.

2. The electron-beam lithography system of claim 1 wherein the beamlet blanking section comprises an active beam aperture array having m rows and n columns of apertures.

3. The electron-beam lithography system of claim 2 wherein the system further comprises:

a third electron lens group to direct each electron beamlet in the array of electron beamlets having the selected shape towards a corresponding aperture in the active beam aperture array;

a logic circuit associated with each aperture in the active beam aperture array to deflect selected electron beamlets passing through the active beam aperture array;

a contrast aperture to absorb the selected electrons beamlets deflected by the active beam aperture array and to absorb x-rays generated by electrons striking surfaces in the electron-beam lithography system; and a fourth electron lens group to focus the electron beamlets passing undeflected through the active beam aperture array onto the object to be exposed.

4. The electron-beam lithography system of claim 3 wherein the system further comprises a first active beam aperture array shield having m rows and n columns of apertures corresponding to the apertures in the active beam aperture array and wherein the first active beam aperture array shield is disposed between the second multi-aperture array and the active beam aperture array.

5. The electron-beam lithography system of claim 4 wherein the first active beam aperture array shield comprises a layer of a low atomic number material and a layer of a high atomic number material.

6. The electron-beam lithography system of claim 5 wherein the system further comprises a second active beam aperture array shield having m rows and n columns of apertures corresponding to the apertures in the active beam aperture array and wherein the second active beam aperture array shield is disposed between the active beam aperture array and the object to be exposed.

7. The electron-beam lithography system of claim 6 wherein the second active beam aperture array shield comprises a layer of a low atomic number material and a layer of a high atomic number material.

8. The electron-beam lithography system of claim 7 wherein the system further comprises a first multi-aperture array shield having m rows and n columns corresponding to the apertures in the first multi-aperture array and wherein the first multi-aperture array shield is disposed between the source of electrons and the first multi-aperture array.

9. The electron-beam lithography system of claim 8 wherein the first multi-aperture array shield comprises a layer of a low atomic number material and a layer of a high atomic number material.

10. The electron-beam lithography system of claim 9 wherein the system further comprises a second multi-aperture array shield having m rows and n columns corresponding to the apertures in the second multi-aperture array and wherein the second multi-aperture array shield is disposed between the first multi-aperture array and the second multi-aperture array.

11. The electron-beam lithography system of claim 10 wherein the second multi-aperture array shield comprises a layer of a low atomic number material and a layer of a high atomic number material.

12. The electron-beam lithography system of claim 11 wherein the system further comprises at least one x-ray baffle.

13. The electron-beam lithography system of claim 12 wherein the at least one x-ray baffle is disposed between the second multi-aperture array and the active beam aperture array.

14. The electron-beam lithography system of claim 13 wherein the fourth electron lens group comprises:

a first symmetric magnetic doublet disposed between the active beam aperture array and the surface to be exposed; and a second symmetric magnet doublet disposed between the first symmetric magnetic doublet and the object to be exposed.

15. The electron-beam lithography system of claim 14 wherein the system further comprises a deflection system disposed in the second symmetric magnetic doublet to deflect each electron beamlet onto a portion of the object to be exposed.

16. The electron-beam lithography system of claim 15 wherein the system further comprises a control unit coupled to:

the electron deflector;

each logic circuit associated with each aperture in the active beam aperture array;

the deflector system; and the stage.

17. The electron-beam lithography system of claim 16 wherein a contrast aperture is disposed at a crossover point of the first symmetric magnetic doublet.

18. The electron-beam lithography system of claim 17 wherein the logic circuit associated with each aperture includes a memory unit to store a next pattern logic.

19. The electron-beam lithography system of claim 1 wherein the source of electrons comprises an electron gun.

20. The electron-beam lithography system of claim 1 wherein the source of electrons comprises an array of individual electron sources that produce an array of electron beamlets having m rows and n columns that correspond to the apertures of the first multi-beam aperture array.

21. A method of exposing an object with electrons in an electron-beam lithography system, the method comprising:
   generating electrons;
   directing the electrons in a collimated beam in an axial direction towards the object to be exposed;
   directing the collimated beam of electrons through a beamlet shaping section comprising a first multi-aperture array having m rows and n columns of apertures having a first shape, a second multi-aperture array having m rows and n columns of apertures having a second shape;
   directing the electrons emerging from the beamlet shaping section through a beamlet blanking section;
   directing electron beamlets having the first shape formed by the first multi-aperture array towards the center of corresponding apertures in the second multi-aperture array; and
   deflecting each of the electron beamlets formed by the first multi-aperture array away from the center of the corresponding aperture in the second multi-aperture array.

22. The method of claim 21 wherein directing the electrons through a beamlet blanking section comprises directing the electrons through an active beam aperture array having m rows and n columns of apertures.

23. The method of claim 22 wherein the method further comprises:
   directing each electron beamlet in the array of electron beamlets having the selected shape towards a corresponding aperture in the active beam aperture array;
   deflecting selected electron beamlets passing through the active beam aperture array with logic circuits associated with each aperture in the active beam aperture array;
   absorbing the selected electrons beamlets deflected by the active beam aperture array with a contrast aperture; and
   focusing the electron beamlets passing undeflected through the active beam aperture array onto the object to be exposed.

24. The method of claim 23 wherein the method further comprises directing the electron beamlets having the selected shape through a first active beam aperture array shield having m rows and n columns of apertures corresponding to the apertures in the active beam aperture array and wherein the first active beam aperture array shield is disposed between the second multi-aperture array and the active beam aperture array.

25. The method of claim 24 wherein directing the electron beamlets having the selected shape through a first active beam aperture array shield comprises directing the electron beamlets through a first active beam aperture array shield comprising a layer of a low atomic number material and a layer of a high atomic number material.

26. The method of claim 25 wherein the method further comprises directing the electron beamlets having the selected shape through a second active beam aperture array shield having m rows and n columns of apertures corresponding to the apertures in the active beam aperture array and wherein the second active beam aperture array shield is disposed between the active beam aperture array and the object to be exposed.

27. The method of claim 26 wherein directing the electron beamlets having the selected shape through a second active beam aperture array shield comprises directing the electron beamlets through a second active beam aperture array shield comprising a layer of a low atomic number material and a layer of a high atomic number material.

28. The method of claim 27 wherein the method further comprises directing the electron beamlets through a first multi-aperture array shield having m rows and n columns corresponding to the apertures in the first multi-aperture array and wherein the first multi-aperture array shield is disposed between the source of electrons and the first multi-aperture array.

29. The method of claim 28 wherein directing the electron beamlets through a first multi-aperture array shield comprises directing the electron beamlets through a first multi-aperture array shield comprising a layer of a low atomic number material and a layer of a high atomic number material.

30. The method of claim 29 wherein the method further comprises directing the electron beamlets through a second multi-aperture array shield having m rows and n columns corresponding to the apertures in the second multi-aperture array and wherein the second multi-aperture array shield is disposed between the first multi-aperture array and the second multi-aperture array.

31. The method of claim 30 wherein directing the electron beamlets through a second multi-aperture array shield comprises directing the electron beamlets through a second multi-aperture array shield comprising a layer of a low atomic number material and a layer of a high atomic number material.

32. The method of claim 31 wherein the method further comprises directing the electron beamlets through at least one x-ray baffle.

33. The method of claim 32 wherein directing the electron beamlets through at least one x-ray baffle comprises directing the electron beamlets through at least one x-ray baffle disposed between the second multi-aperture array and the active beam aperture array.

34. The method of claim 33 wherein the method further comprises:
   directing the electron beamlets through a first symmetric magnetic doublet disposed between the active beam aperture array and the surface to be exposed; and
   directing the electron beamlets through a second symmetric magnetic doublet disposed between the first symmetric magnetic doublet and the object to be exposed.

35. The method of claim 34 wherein the method further comprises directing the electron beamlets through a deflection system disposed in the second symmetric magnetic doublet.

36. The method of claim 35 wherein the method further comprises controlling the electron deflector, each logic circuit associated with each aperture in the active beam aperture array, the deflecting, and movement of a stage which supports the object with a control unit.

37. The electron beam lithography system of claim 1, wherein the first multi-aperture array forms an array of electron beamlets having the first shape; and
   wherein the electron deflector deflects each electron beamlet in the array of electron beamlets having the first shape away from the center of the corresponding aperture in the second multi-aperture array, whereby each electron beamlet in the array of electron beamlets having a first shape is superimposed into a portion of the corresponding aperture in the second multi-aperture array, and wherein each electron beamlet in the array of electron beamlets is formed into a selected shape determined by the superposition of the deflected electron beamlets having the first shape onto the second shape of the apertures of the second multi-aperture array.

38. The method of claim 21, wherein each electron beamlet in the array of electron beamlets having a first shape is superimposed onto a portion on the corresponding aperture in the second multi-aperture array, and wherein each electron beamlet in the array of electron beamlets is formed into a selected shape determined by the superposition of the deflected electron beamlets having the first shape onto the second shape of the apertures of the second multi-aperture array.

* * * * *